(12) United States Patent
Cai et al.

(10) Patent No.: US 7,700,993 B2
(45) Date of Patent: Apr. 20, 2010

(54) CMOS EPROM AND EEPROM DEVICES AND PROGRAMMABLE CMOS INVERTERS

(75) Inventors: Jin Cai, Cortland Manor, NY (US); Tak H. Ning, Yorktown Heights, NY (US); John M. Safran, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 336 days.

(21) Appl. No.: 11/935,143

(22) Filed: Nov. 5, 2007

(65) Prior Publication Data

US 2009/0114971 A1    May 7, 2009

(51) Int. Cl.
    *H01L 27/092* (2006.01)
(52) U.S. Cl. .................. 257/315; 257/314; 257/313; 257/E27.112; 257/E27.067
(58) Field of Classification Search .......... 257/296, 257/314, 313, 315, E27.112, E27.067
See application file for complete search history.

(56) References Cited

U.S. PATENT DOCUMENTS

| 5,016,217 | A | 5/1991 | Brahmbhatt |
| 5,181,090 | A | 1/1993 | Maruo |
| 5,781,031 | A | 7/1998 | Bertin |
| 5,886,376 | A | 3/1999 | Acovic |
| 6,207,991 | B1 | 3/2001 | Rahlm |
| 6,215,689 | B1 | 4/2001 | Chorr |
| 6,498,371 | B1 | 12/2002 | Krishnan |
| 6,678,190 | B2 | 1/2004 | Yang |
| 6,711,064 | B2 | 3/2004 | Hsu et al. |
| 6,841,447 | B1 | 1/2005 | Logie |
| 6,870,213 | B2 * | 3/2005 | Cai et al. .................. 257/314 |
| 7,091,075 | B2 | 8/2006 | Chaudhry |
| 7,244,976 | B2 | 7/2007 | Cai et al. |

OTHER PUBLICATIONS

C.C.-H. Hsu et al. "A High-Speed Low-Power P-Channel Flash EEPROM Using Silicon-Rich Oxide as Tunneling Dielectric," 1992 Int. Conf. Solid-State Devices and Materials, Extended Abstract, pp. 140-142 (1992).

Date et al. "Increased Hot-Carrier Effects Using SiGe Layers in Vertical Surrounding-Gate MOSFETs" IEEE Transactions on Electron Devices vol. 48 No. 12, pp. 2690-2694 (Dec. 2001).

Lindert et al. "Sub-60-nm Quasi-Planar FinFETs Fabricated Using a Simplified Process", IEEE Electron Device Letters, vol. 22, No. 10, pp. 487-489 (Oct. 2001).

* cited by examiner

*Primary Examiner*—Leonardo Andújar
(74) *Attorney, Agent, or Firm*—Graham S. Jones, II; Robert M. Trepp; Louis J. Percello

(57) ABSTRACT

A CMOS EPROM, EEPROM or inverter device includes an nFET device with a thin gate dielectric layer and a pFET device juxtaposed with the nFET device with a thick gate dielectric layer and a floating gate electrode. The thick gate dielectric layer is substantially thicker than the thin gate dielectric layer. A common drain node connected both FET devices has no external connection in the case of a memory device and has an external connection in the case of an inverter. There are external circuit connections to the source regions of both FET devices and to the gate electrode of the nFET device. The pFET and nFET devices can be planar, vertical or FinFET devices.

25 Claims, 19 Drawing Sheets

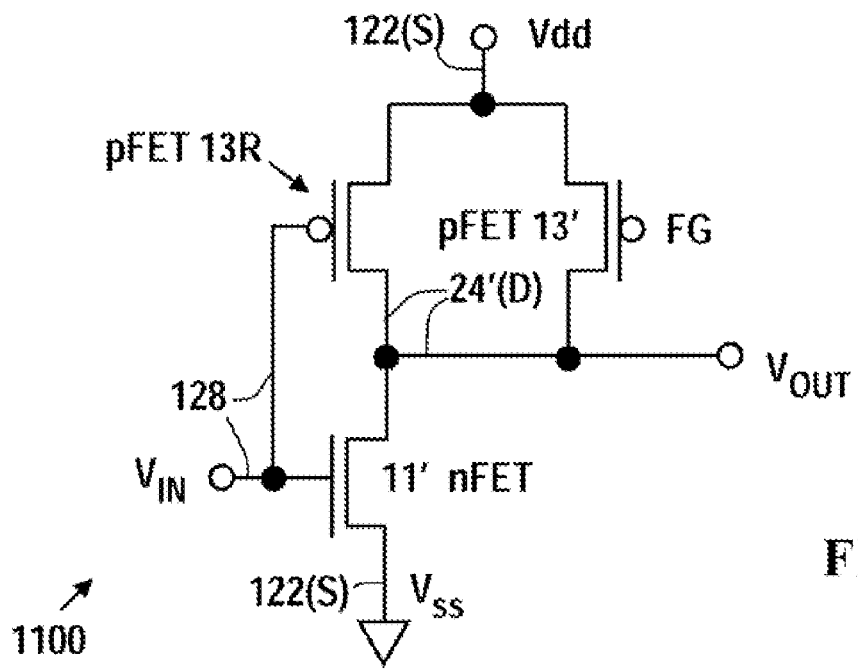
FIG. 11A
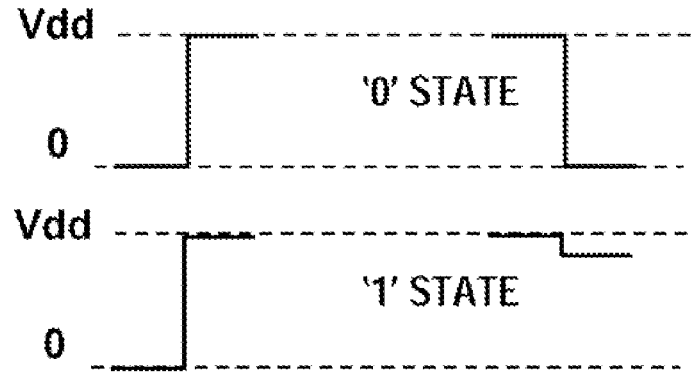
FIG. 11B
FIG. 11C
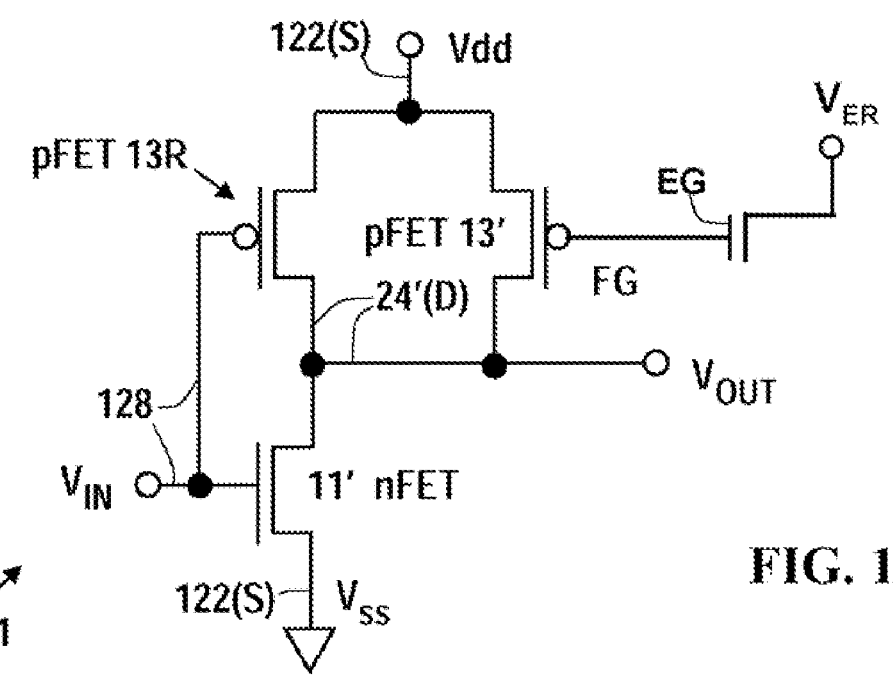
FIG. 11D

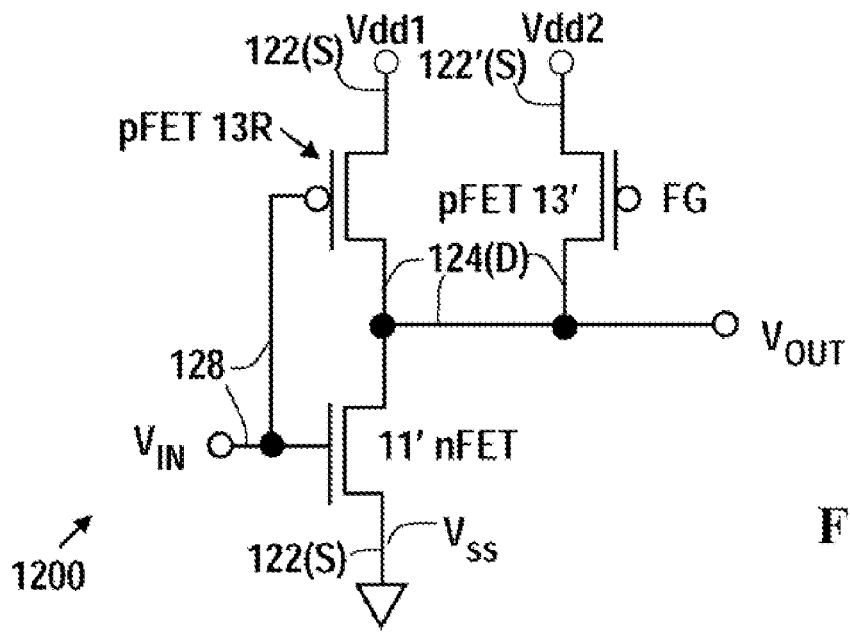
FIG. 12A
FIG. 12B
FIG. 12C
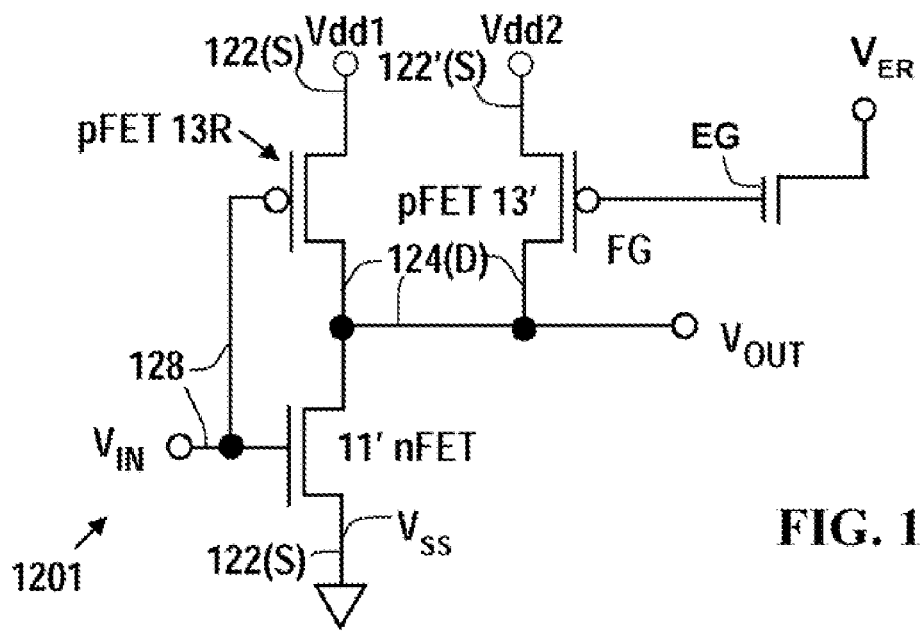
FIG. 12D

CMOS EPROM AND EEPROM DEVICES AND PROGRAMMABLE CMOS INVERTERS

BACKGROUND

This invention relates to Complementary Metal Oxide Silicon (CMOS) Electrically Programmable Read Only Memory (EPROM) and CMOS EEPROM (Electrically Erasable and Programmable Read Only Memory) devices, which are especially suitable for embedded applications.

In many applications, particularly in System-on-Chip (SoC) applications, designers want to have a certain number of embedded non-volatile memory devices on the microprocessor or Application-Specific Integrated Circuit (ASIC) chips. The preferred approach for meeting this need is to provide embedded non-volatile memories that require little or no additional process cost to the base logic technology. Often, the additional requirements for such embedded non-volatile memories are high density, i.e. small cell size, low power, and high speed.

In a regular CMOS logic process, non-volatile memory devices are typically made using charge storage in a floating gate electrode. In general, it takes a lower voltage to inject hot electrons from silicon into a floating gate electrode than to inject electrons from silicon into a floating gate electrode by Fowler-Nordheim tunneling. As a result, for high-speed and low-voltage operation, hot electron injection is typically used.

Floating gate Field Effect Transistors (FETs) including a control gate are well known. A floating gate electrode differs from a control gate electrode in that it has no direct electrical connection to any external component and is surrounded by isolation on all sides. In a typical floating gate FET including a control gate, the control gate is positioned on top of the floating gate. The presence of a control gate electrode enables an FET device to function as a regular FET, while a floating gate electrode collects and stores injected electrons or holes. The floating gate electrode provides a method for changing the threshold voltage needed to pass a charge from the source region of the FET to the drain region thereof. The presence of the control gate electrode adds control to the injection of charges into and out of the floating gate region of the FET, thus enabling the FET device to function as an electrically programmable or reprogrammable memory device depending upon other factors as explained below.

Source-side injection flash cells or split gate flash cells are commonly used as embedded flash memories. In a split gate cell, the floating gate overlies only a portion of the channel and the control gate electrode overlies both the floating gate electrode and the remainder of the channel. In other words, there are two transistors in series between a source and a drain. One relatively popular flash cell employs oxidized polysilicon to create sharp points in the polysilicon in order to enhance the electric field. This in turn allows erasure at lower voltages and provides for thicker dielectric layers between the floating gate electrode and the control gate electrode. The LOCalized Oxidation of Silicon (LOCOS) process is commonly used for fabricating such cells to form an insulator cap over the polysilicon of the floating gate electrode. The LOCOS process creates sharp points on the floating gate electrode, resulting in a bird's beak structure.

Nevertheless, the existing flash memory cells exhibit two major shortcomings which are high programming voltage required and non-planar cell topography due to the presence of the floating gate electrode.

In a floating gate device, electrons are injected into the floating gate electrode, either by hot electron injection or by electron tunneling (Fowler-Nordheim or F-N tunneling). In the case of hot electron injection, it is well-known that it is much more efficient to use avalanche hot electron injection using a p-channel FET device than to use channel hot electron injection using an n-channel FET device. A paper by Hsu et al. entitled "A High-Speed Low-Power P-Channel Flash EEPROM Using Silicon-Rich Oxide as Tunneling Dielectric," 1992 Int. Conf. Solid-State Devices and Materials, Extended Abstract, pp. 140-142 (1992) includes experimental evidence that it is desirable to use both a p-channel floating-gate FET as the memory element and avalanche hot electron injection as the programming mechanism.

For embedded applications, it is desirable to use an access or select transistor connected in series with the memory element to form the non-volatile memory cell. While adding a select transistor adds area to the memory cell, the use of a select transistor avoids many issues of operation of a true single-device memory cell with no access transistor. For example, such an access transistor guarantees that there is no over-erase problem, and avoids disturbing the non-selected cells.

For the select transistor, it is desirable to use an n-channel FET, instead of a p-channel FET, because an n-channel FET typically has twice the performance as a p-channel FET due to higher electron mobility. In other words, it is desirable to have a CMOS non-volatile memory device where the n-channel FET is used as an access transistor and the floating-gate p-channel FET is used as the memory element.

U.S. Pat. No. 7,091,075 B2 of Chaudhry entitled "Fabrication of an EEPROM Device with SiGe Source/Drain Regions" shows a non-volatile memory device which employs an nFET and a pFET, but it is built using bulk CMOS devices, not SOI CMOS. The pFET is used as select device while the nFET gate electrode is floating and is used as memory device. The present invention teaches using a pFET, with its gate electrode floating, as the memory device, while the nFET is used as select device. A problem with such a device are first that a pFET select device has only about half the performance of a nFET select device and second that a floating-gate nFET used as memory device has much higher power dissipation compared with a floating-gate pFET employed as a memory device.

U.S. Pat. No. 6,841,447 of Logie entitled "EEPROM Device having an Isolation-Bounded Tunnel Capacitor and Fabrication Process" describes a memory element built using bulk CMOS devices, not an SOI CMOS consisting of both an nFET and a pFET, with the floating gate electrode of the pFET and the floating gate electrode of the nFET are connected together electrically. Also there is a control gate electrode "on top" of the connected floating gate electrode. A problem with such a device is that the resulting memory element, consisting of an nFET and a pFET, is significantly larger than the present invention where only the floating-gate pFET is used as memory element. In contrast to Logie, according to the present invention, only the pFET, with its gate electrode floating, is used as memory element.

U.S. Pat. No. 5,016,217 of Brahmbhatt entitled "Logic Cell Array Using CMOS EPROM Cells Having Reduced Chip Surface Area" describes an Electrically Programmable Read Only Memory (EPROM) memory cell including a serially connected Complementary Metal Oxide Silicon (CMOS) transistor pair with common floating gate electrodes and common control gate electrodes. A third n-type floating gate FET is used to program the memory cell. The floating and control gates of the third transistor are connected to the common floating and control gates, respectively, of the CMOS transistor pair. A tri-state memory cell can be provided by connecting the source of the p-channel transistor of the CMOS pair to the common control gates. An EPROM cell is described including the pFET and the nFETs in the cell all of which have a floating gate. Those floating gates are all electrically connected together. Each FET has a control gate above the floating gate. According to the present invention, the nFET does not have a floating gate, while the pFET has a floating gate but without a control gate. A problem with such a device is that a very large area is taken up by the floating-gate memory element which covers all three transistors. In addition, Brahmbhatt is built using bulk CMOS devices which have an additional problem that the pFET is built using an n-well and the nFETs are built using a p-well. Since the well regions are larger than the actual pFET and nFET devices themselves, the resulting area taken up to build the Brahmbhatt memory device is significantly larger than the area of a memory device built in accordance with the present invention.

U.S. Pat. No. 5,886,376 of Acovic et al entitled "EEPROM Having Coplanar On-Insulator FET and Control Gate" describes an electrically erasable programmable read-only memory (EEPROM) which includes an FET and a control gate spaced apart on a first insulating layer. A second insulating layer is formed over the FET and the control gate and a common floating gate on the second insulating layer over the channel of the FET and the control gate, the floating gate thus also forms the gate electrode of the FET. The EEPROM devices may be interconnected in a memory array and a plurality of memory arrays may be stacked on upon another. In contrast, the present invention overcomes the problem of using a non-standard Silicon-On-Insulator (SOI) CMOS process to make EEPROM arrays with high areal density.

U.S. Pat. No. 6,215,689 B1 of Chorr entitled "Architecture, Circuitry and Method for Configuring Volatile and/or Non-Volatile Memory for Programmable Logic Applications" describes a memory device, states as follows: "Architecture, circuitry, and methods are provided for operating a high speed, volatile programmable logic integrated circuit using back-up non-volatile memory cells configured on an integrated circuit separate from the programmable logic integrated circuit. The lower density non-volatile memory cells can be formed on an integrated circuit using fabrication steps similar to those used to form, e.g., EEPROM devices or, more specifically, flash EEPROM devices. The programmable logic integrated circuit includes high density, volatile memory cells integrated with high speed, low density configurable CMOS-based logic. By using two separate processing technologies on two separate and distinct monolithic substrates, and interconnecting the separate integrated circuits on a singular monolithic substrate, the advantages of non-volatility can be combined with a high speed programmable circuit. The pins extending from the programmable logic device can be mounted in various ways to corresponding receptors on a printed circuit board. The architecture, circuitry, and method thereby present a packaged device which inherently has the same characteristics as a single integrated circuit, yet is actually two integrated circuits having the benefits of non-volatility as well as the benefits of higher speed, higher density volatile logic blocks within a programmable logic device or complex programmable logic device." In accordance with the present invention, the memory element is fully compatible with CMOS logic process, and both memory and logic elements are made on the same silicon chip. In Chorr memory elements and logic elements are made on different silicon chips by different process flows, with the problem that the device lacks the desirable attribute of integrating all the desired logic circuits and memory functions on a single chip.

U.S. Pat. No. 6,207,991 B1 of Rahim "Integrated Non-Volatile and CMOS Memories Having Substantially the Same Thickness Gates and Methods of Forming the Same" describes a method of forming non-volatile memory (e.g. an EEPROM device) and a bulk CMOS device (e.g. a RAM), not a SOI CMOS, on a single die or chip, and a structure formed by the method. In one embodiment, the control gate of the storage transistor as well as the isolation gate of the isolation transistor may be formed during the same manufacturing process step, and thus may be formed of the same gate polysilicon material and may have similar thickness. The memory device in the Rahim patent is an nFET device. A problem with such an nFET memory device is that it requires more power dissipation to program a floating-gate nFET than a floating-gate pFET. In the present invention, the memory device is a pFET device.

U.S. Pat. No. 6,498,371 of Krishnan et al. entitled "Body-Tied-To-Body SOI CMOS Inverter Circuit" describes an SOI CMOS inverter circuit in which the drain of each of an n-FET and a P-FET are electrically coupled to form an output of the inverter circuit by a silicide layer in combination with a body region formed in the SOI layer ties. At the same time, however, the body regions remain floating electrically so that the benefits of SOI are maintained.

To reduce cell area in bulk CMOS implementations, a p-FET is usually used for an access transistor instead of an n-FET. Such all p-FET bulk CMOS implementations are described in both U.S. Pat. No. 6,678,190 of Yang entitled "Single Poly Embedded EPROM" and U.S. Pat. No. 6,711,064 of Hsu entitled "Single-Poly EPROM". U.S. Pat. No. 6,678,190 of Yang describes an erasable programmable read only memory comprising two serially connected P-type metal-oxide semiconductor (MOS) transistors wherein the control gate is omitted in the structure for layout as the bias is not necessary to apply to the floating gate during the programming mode. U.S. Pat. No. 6,711,064 of Hsu describes a single-poly EEPROM which includes a first PMOS transistor that is serially connected to a second PMOS transistor. The first and second PMOS transistors are both formed on an N-well of a P-type substrate. The first PMOS transistor includes a floating gate, a first $P^+$ doped drain region, and a first $P^+$ doped source region. The second PMOS transistor includes a gate and second $P^+$ doped source region. The first $P^+$ doped source region of the first PMOS transistor serves as a drain of the second PMOS transistor. For erasing the single-poly EEPROM, an erase gate which extends to the floating gate is provided in the P-type substrate. A problem with such a device is that a pFET access transistor has only about half the performance of an nFET access transistor.

B Commonly assigned U.S. Pat. No. 7,244,976 of Cai et al. entitled "EEPROM Device with Substrate Hot-Electron Injector for Low-Power Programming" describes a low programming power, high speed EEPROM device adapted for large scale integration. The device comprises a body, a source, and a drain, plus it has means for injecting a programming current into the body. The hot carriers from the body enter the floating gate with much high efficiency. The drain current of the device, which is built on an insulator, with a bottom common plate, and a top side body, is controlled by the body bias. The device is adapted for SOI and thin film technologies.

FIG. 1A is a schematic diagram of a cross section of a prior art CMOS inverter 10 comprising an SOI nFET 11 and an SOI pFET 13. FIG. 1B is an electrical schematic diagram of the device of FIG. 1A. The inverter 10 is formed on a substrate 12 preferably composed of silicon, with a Buried Oxide (BOX) layer 14 formed on the top surface thereof. A left isolation oxide region 15L is formed over the BOX layer 14 on the left of the inverter 10; and a right isolation oxide region 15R is formed over the BOX layer 14 on the right of the inverter 10. An SOI layer composed of doped regions 16, 17, 18, 19, 20 and 21 is formed over the BOX layer 14 between left isolation oxide region 15L and the right isolation oxide region 15R. The nFET 11 is composed of an n+ doped source region 16, a p doped channel region 17 and an n+ drain region 18, which are formed on the top surface of the BOX layer 14 adjacent to the left isolation oxide region 15L. The pFET 13 is composed of p+ doped drain region 19, an n doped channel region 20 and a p+ source region 21 which are formed on the top surface of on the BOX layer 14 between the n+ drain region 18 and the right isolation oxide region 15R.

The nFET 11 includes a thin gate dielectric (silicon dioxide or other electrical insulating material) layer 23 formed over the p doped channel region 17 of the nFET 11 and a first gate electrode G1, which is electrically conductive, located above the thin gate dielectric layer 23.

The pFET 13 includes a second, thin gate dielectric (silicon dioxide or other electrical insulating material) layer 25, formed over the n doped channel region 20 of the pFET 13, and a second gate electrode G2, which is also electrically conductive, located above the second gate dielectric layer 25. The first and second gate dielectric layers 23 and 25 have thicknesses which are thin, as stated above, and are preferably substantially equal.

A first silicided contact 22 (S) is formed on the top surface of the source region 16 of the nFET 11. A second silicided contact 24, which is formed on the combined top surfaces of both the drain region 18 of the nFET 11 and the drain region 19 of the pFET short circuits the drains regions 18 and 19 together. A third silicided contact 26(S) is formed on the top surface of the source region 21 of the pFET 13. The first silicided contact region 22(S) and the second silicided contact region 24 are spaced away from the first gate electrode G1, and the second and third silicided contact regions 24 and 26(S) are spaced away from the second gate electrode G2.

Referring to both FIGS. 1A and 1B, the first silicided contact 22 connects reference potential $V_{ss}$, i.e. ground voltage, which equals zero Volts, to the source region 16 of the nFET 11. The first gate electrode G1 is connected by line 28A to an input terminal $V_{IN}$ and to line 28B which connects to the second gate electrode G2, so that the first gate electrode G1 is electrically connected to the second gate electrode G2, with both of them being at the input potential $V_{IN}$. The second silicided contact 24 is connected to an output terminal $V_{OUT}$. The third silicided contact 26(S) is connected to a power supply terminal $V_{dd}$. Referring to FIG. 1C, the input and output voltages of the inverter 10 are related so that when $V_{IN}$ is in a logic state of "0" or has a value substantially equal to zero, $V_{OUT}$ is in a logic state of "1" or has a value substantially equal to $V_{dd}$, and when $V_{IN}$ is in a logic state of "1" or has a value substantially equal to $V_{dd}$, $V_{OUT}$ is in a logic state of "0" or has a value substantially equal to zero. These relationships are indicated in Table I below, as will be well understood by those skilled in the art.

TABLE I

| $V_{IN}$ | $V_{OUT}$ |
|---|---|
| "0" or zero | "1" or $V_{dd}$ |
| "1" or $V_{dd}$ | "0" or zero |

FIG. 1D is a schematic diagram of a cross section of a prior art MOS FET EPROM device 30 comprising a bulk pFET 31 and another bulk pFET 33, without any n-FET devices, formed on an N-well 39. The N-well 39 is centered between the right edge of a left isolation oxide region 35L and the left edge of a right isolation oxide region 35R. The pFET 31, which is formed adjacent to the left isolation oxide region 35L, is composed of an p+ doped source region 32(S), an n doped channel region CH1 and the left half of a shared, p+ doped region 37. The pFET 33 is composed of the right hand half of the shared, p+ doped region 37, an n doped channel region CH2 and a p+ drain region 36 formed between the pFET 31 and the right isolation oxide region 35R. The shared, p+ region 37 is the source for the pFET device 33. For a pFET, the region with higher voltage is the source and the region with the lower voltage is the drain, visa versa for an nFET. For two pFETs in series, as in FIG. 1D, the highest voltage (Vdd) is applied to region 32(S), or the source of pFET 31, and the region 37 is the drain of pFET device 31 as well as the source of the pFET device 33. The p+ drain region 36 is the drain of pFET device 33.

As in FIG. 1A, the pFET 31 includes a thin gate dielectric (gate oxide) layer 23 formed over the first channel region CH1 of the pFET 31 and a third gate electrode G3, which is electrically conductive, located above the thin gate dielectric layer 23.

The pFET 33 includes a first thick gate dielectric (e.g. silicon oxide) layer 25F, formed over the n doped channel region CH2 of the pFET 33, and a first floating gate electrode FG1, which is also electrically conductive, located above the first thick gate dielectric layer 25F. The gate dielectric layer 23 and the first thick gate dielectric layer 25F have substantially different thicknesses with the first thick gate dielectric layer 25F being substantially thicker than gate dielectric layer 23, since the thick gate dielectric must be sufficiently thick to prevent leakage of charge stored on the floating gate FG1, as stated by the following references. U.S. Pat. No. 6,992,926 of Iwase et al. entitled "Driver Circuit for Semiconductor Storage Device and Portable Electronic Apparatus" states "For prevention of leakage of holding charges, the thickness of an insulating film isolating the floating gate from the channel region or the well region cannot be reduced to about 7 nm or less." In addition, an article by Prinz et al entitled "Nonvolatile memories for 90 nm SoC and beyond" stated as follows: "To maintain high reliability for safety-critical applications, the insulators surrounding the floating gate must be thicker than 100 angstroms if error correction is not employed. This is due to the fact that a single point defect in an insulator is sufficient to create a leakage path through which the entire floating gate charge can leak out.", EE-Times, http://www.eetimes.com/story/OEG20030317S0057 (2003)

SUMMARY OF THE INVENTION

It is an object of this invention to provide a non-volatile memory device, consisting of an n-FET channel FET as the access transistor and a floating-gate p-FET channel FET as the memory element, to overcome the problem of the slow access transistor speed in non-volatile memory devices using a p-FET channel FET as access transistor and a floating-gate p-FET channel pFET as the memory element, such as the prior art shown in FIG. 1D.

Unlike the U.S. Pat. No. 5,781,031 of Bertin et al the present invention teaches provision of a non-volatile memory device consisting of an nFET as the access transistor and a floating-gate pFET as the memory element.

In comparison to U.S. Pat. No. 5,016,217 of Brahmbhatt which has the problem that a very large area is taken up by a floating-gate memory element which covers three transistors, the present invention uses only a floating-gate pFET as the memory element.

The present invention employs a floating gate pFET as the memory device, while the nFET is used as select device which overcomes a problem of U.S. Pat. No. 7,091,075 of Chaudhry which are stated above, i.e. first that a pFET select device has only about half the performance of a nFET select device and second that a floating-gate nFET as memory device has much higher power dissipation compared with a floating-gate pFET employed as a memory device.

While the CMOS EPROM and EEPROM devices of the present invention can be embodied as bulk CMOS devices, the devices have higher density in SOI CMOS embodiments, than in bulk CMOS. Furthermore, the CMOS non-volatile memory devices EPROM and EEPROM devices of the present invention can be used to configure programmable CMOS logic circuits. Since the CMOS non-volatile memory devices of this invention function like a CMOS inverter, they can be configured to form CMOS logic circuits that are programmable. In a programmable CMOS logic circuit, if the memory element is not programmed, the logic circuit works in the same way as a regular logic circuit. However, by programming the non-volatile memory device in the logic circuit, the output of the logic circuit can be set at either the logic high state or the logic low state independently from the input signal applied to the logic circuit.

In accordance with this invention, CMOS non-volatile memory devices are provided, including EPROM (Electrically Programmable Read-Only Memory) devices without an erase device, EEPROM (Electrically Erasable And Programmable Read-Only Memory) devices with an erase device, and inverters that are programmable or erasable and programmable. The CMOS non-volatile memory devices of this invention can be built using a standard CMOS logic process, provided that the floating-gate memory FET has negligible gate leakage current. The floating-gate pFET comprises a thick-oxide transistor, which has the advantage that it resists tunneling unwanted discharge therethrough causing loss of data stored in the device.

In accordance with this invention, a CMOS device comprises a substrate upon which a semiconductor nFET device with a first source region, a first channel region, and a first drain region are formed. A thin gate dielectric layer is formed above the first channel region and a first gate electrode formed above said thin gate dielectric layer. A semiconductor pFET device is formed on the substrate juxtaposed with the nFET device and includes a second source region, a second channel region, and a second drain region. A thick gate dielectric layer is formed above the second channel region and a floating gate electrode is formed above the thick gate dielectric layer. The thick gate dielectric layer is substantially thicker than the thin gale dielectric layer in order to be resistant to unwanted tunneling of charge therethrough. A common drain node is connected both to the first drain region and to the second drain region with no external connection to the common drain node in the case of a memory device and with an external connection to the common drain node in the case of an inverter. External circuit connections are provided to the first source region and to the second source region and to the first gate electrode. Preferably, the substrate includes an Silicon on Insulator (SOI) layer formed on bulk silicon; and the substrate includes an N-well for the pFET and a P-well for the nFET. The device may comprise an EPROM, an EEPROM memory, a programmable inverter, or an erasable and programmable inverter; wherein the substrate includes an Silicon on insulator (SOI) layer formed on bulk silicon; wherein the substrate includes an N-well for the pFET and a P-well for the nFET; and/or including an additional pFET device with a thin gate dielectric layer formed in parallel with the semiconductor pFET.

In accordance with another aspect of this invention, a CMOS memory device comprises a semiconductor nFET device and a pFET device formed in and upon a substrate. The nFET device includes a first source region, a first channel region, and a first drain region formed in the substrate A thin gate dielectric layer is formed above the first channel region and a first gate electrode formed above the thin gate dielectric layer. A semiconductor pFET device formed in and upon the substrate is juxtaposed with the nFET device and includes a second source region, a second channel region, and a second drain region formed in the substrate. A thick gate dielectric layer is formed above the second channel region and a floating gate electrode is formed above the thick gate dielectric layer, with the thick gate dielectric layer being substantially thicker than the thin gate dielectric layer in order to be resistant to unwanted tunneling of charge therethrough. A common drain node is connected both to the first drain region and to the second drain region with no external connection to the common drain node. External circuit connections are provided to the first source region and to the second source region and to the first gate electrode. Preferably, the device comprises an EPROM memory or an EEPROM memory.

In accordance with still another aspect of this invention, a CMOS programmable inverter comprises a substrate with a semiconductor nFET device formed in and upon the substrate and a semiconductor pFET device formed in and upon the substrate juxtaposed with the nFET device. The nFET device includes a first source region, a first channel region, and a first drain region formed in the substrate. A thin gate dielectric layer is formed above the first channel region and a first gate electrode is formed above the thin gate dielectric layer. The semiconductor pFET device includes a second source region, a second channel region, and a second drain region formed in the substrate. A thick gate dielectric layer is formed above the second channel region and a floating gate electrode is formed above the thick gate dielectric layer, with the thick gate dielectric layer being substantially thicker than the thin gate dielectric layer in order to be resistant to unwanted tunneling of charge therethrough. A common drain node is connected both to the first drain region and to the second drain region, and external circuit connections are provided to the first source region and to the second source region and to the first gate electrode and to the common drain node with the common drain node comprising an output of the inverter. Preferably, the substrate is selected from the group consisting of an Silicon-On-Insulator (SOI) and an N-well for the pFET and a P-well for the nFET; and/or an additional pFET device with a thin gate dielectric layer is formed in parallel with the semiconductor pFET. Preferably, the CMOS programmable inverter comprises an erasable programmable inverter.

BRIEF DESCRIPTION OF THE DRAWINGS

FIG. 11A shows the schematic electrical circuit diagram for a programmable CMOS inverter in accordance with this invention. FIG. 11B is a voltage trace of the inverter of FIG. 11A in the "0" state. FIG. 11C is a voltage trace of the inverter of FIG. 11A in the "1" state. FIG. 11D is an electrical circuit schematic diagram of a programmable inverter, which is a reprogrammable modification of the inverter of FIG. 11A, which can be reprogrammed.

FIG. 12A shows the electrical circuit schematic diagram for a programmable CMOS inverter. FIG. 12B is a voltage trace of the inverter of FIG. 12A in the "0" state. FIG. 12C is a voltage trace of the inverter of FIG. 12A in the "1" state. FIG. 12D is an electrical schematic diagram of a programmable inverter which is a reprogrammable modification of the inverter of FIG. 12A, which can be reprogrammed.

DESCRIPTION OF THE PREFERRED EMBODIMENTS OF THE INVENTION

The following detailed description describes the preferred embodiments of the invention, together with advantages and features, by way of example, with reference to the drawings.

First Embodiment: EPROM

Figure 1A:
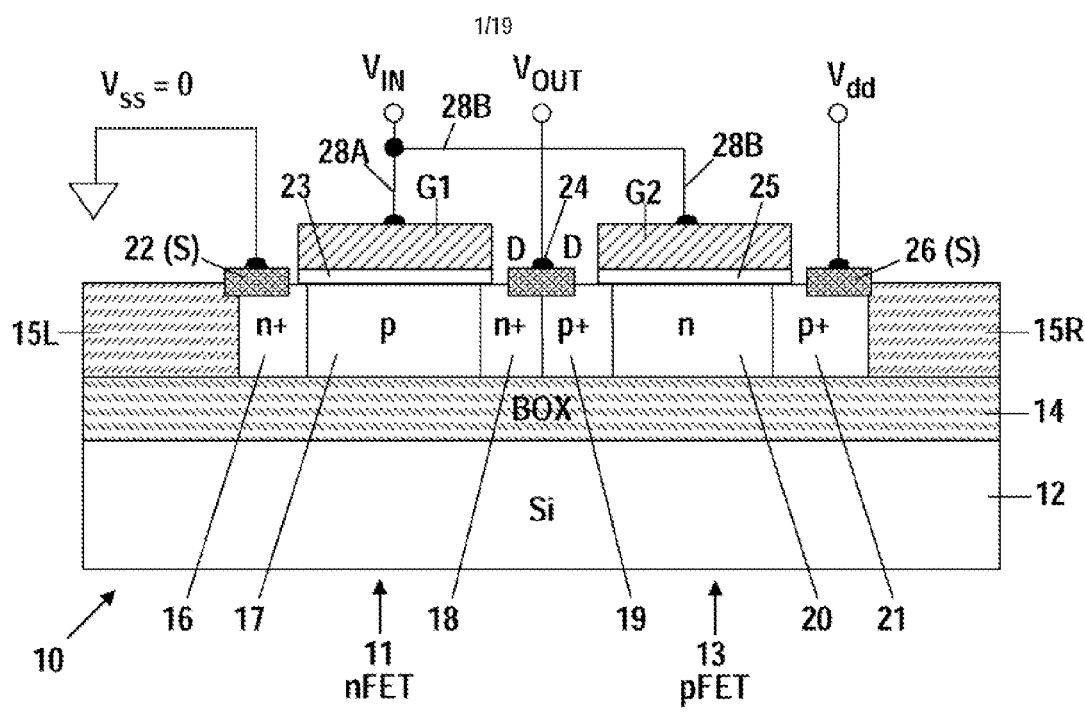
FIG. 1A is a schematic diagram of a cross section of a prior art CMOS inverter comprising an SOI nFET and an SOI pFET formed on a SOI layer on a BOX substrate.
Figure 2A:
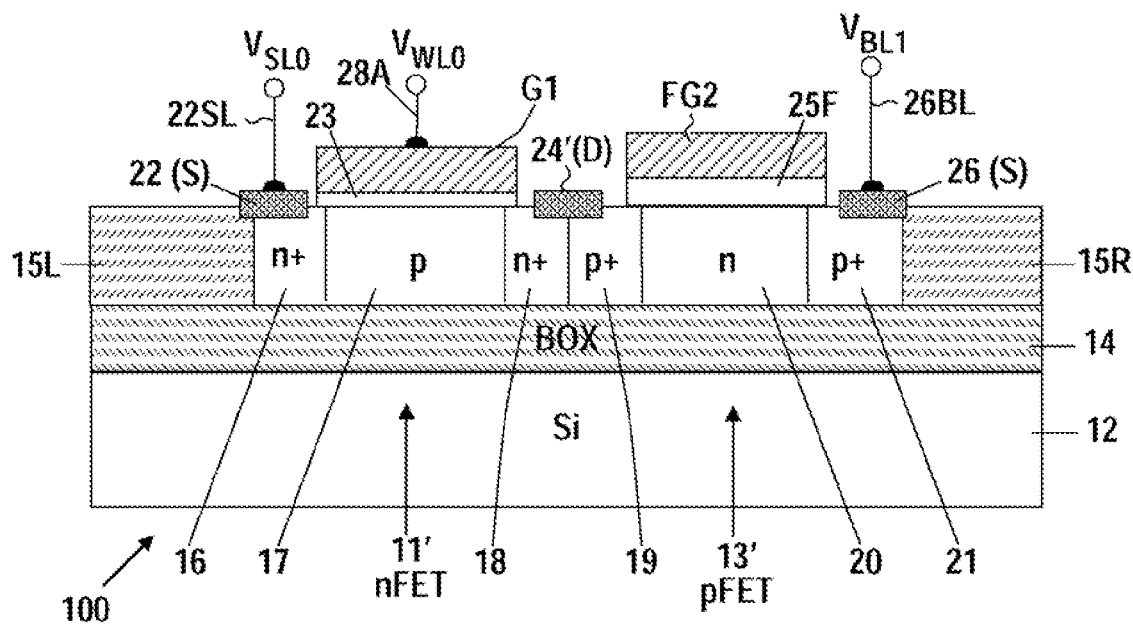
FIG. 2A shows a cross-sectional, schematic view of non-volatile, EPROM cell in accordance with this invention, which is a modification of the inverter of FIG. 1A which includes an access nFET and a floating gate, storage pFET formed on an SOI layer on a BOX substrate.

FIG. 2A is a cross-sectional, schematic view of non-volatile, EPROM cell 100 in accordance with this invention, that is a modification of the inverter 10 of FIG. 1A that includes an access nFET 11' and a floating gate, storage pFET 13' formed on a SOI layer on a BOX substrate. The access nFET 11' includes a gate electrode G1 connected to a WL0 word line 28A and a source contact 22(S) connected to a SL0 select line 22SL. The storage pFET 13' has a floating gate electrode FG2 and a source contact 26(S) connected to a BL1 bitline 26BL. A common, floating, drain contact 24'(D), that connects drain regions of the access nFET 11' to the drain region of the floating gate, storage pFET 13', is not connected to any external line.

For the CMOS configuration of FIG. 2A, the lowest voltage is applied to the source contact 22(S), which is the source of the access nFET device 11'. Source contact 26(S) will have the highest voltage, which is the source of the pFET device 13'.

Figure 2B:
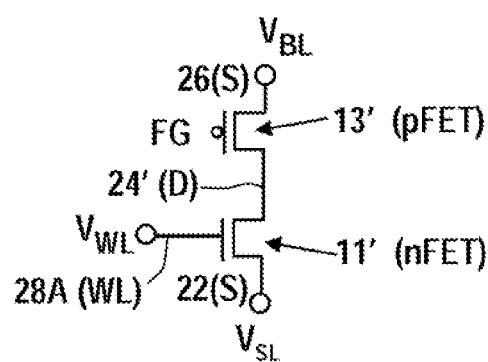
FIG. 2B is an electrical circuit schematic diagram of the EPROM cell of FIG. 2A.

FIG. 2B is an electrical circuit schematic diagram of the EPROM cell 100 of FIG. 2A.

Figure 2C:
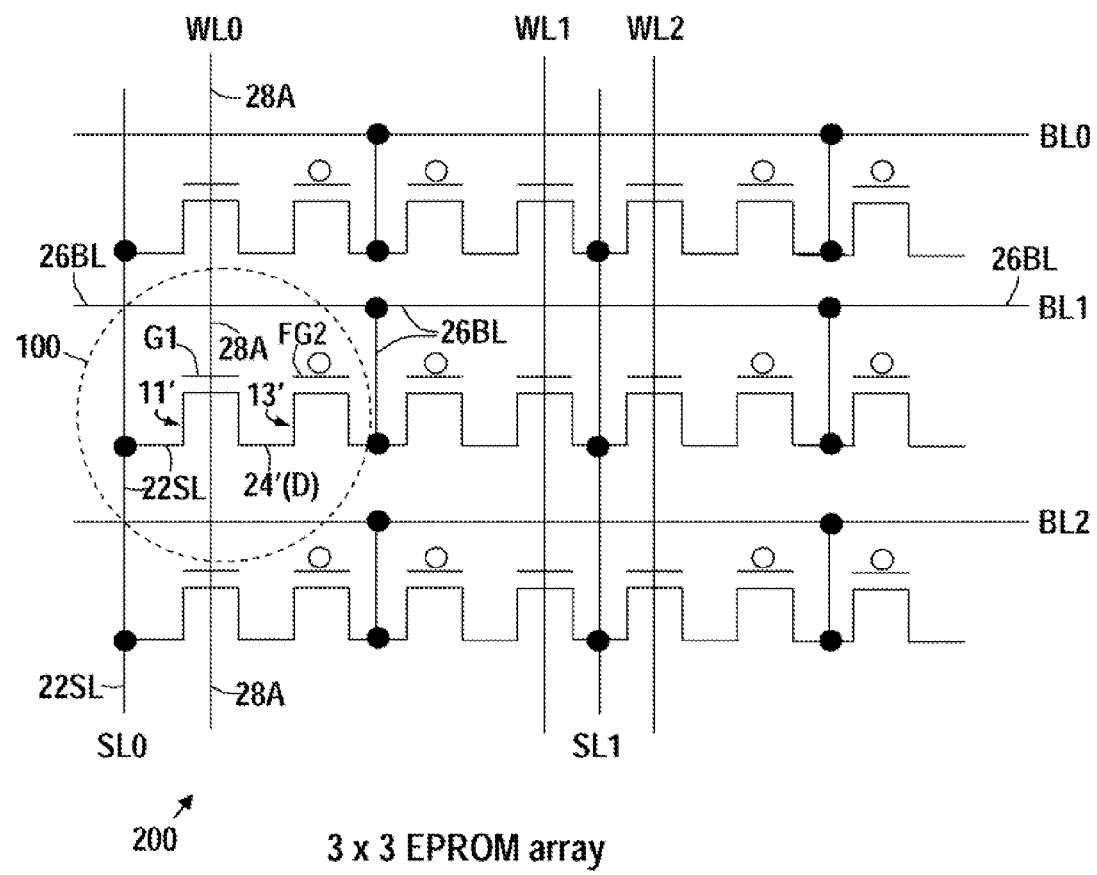
FIG. 2C shows a 3-x-3 EPROM array including the EPROM cell of FIG. 2A with the access nFET and the storage pFET of the EPROM cell connected in the array.

FIG. 2C shows a 3-×-3 EPROM array 200 including the EPROM cell 100 of FIG. 2A with the access nFET 11' and the storage pFET 13' connected in the EPROM array. The EPROM array 200 includes three word lines WL0, WL1, WL2, three bitlines BL0, BL1, BL2, and two select lines SL0, SL1. The gate electrode G1 of the access nFET 11' is connected to a WL0 word line 28A; and the source contact 22(S) of the access nFET 11' is connected to the SL0 select line 22SL. The source contact 26(S) of the storage pFET 13' is connected to the BL1 bitline 26BL; and the floating gate electrode FG2 of the storage pFET 13' is floating, i.e. not connected to any external line.

Referring to FIGS. 2A, 2B, and 2C, the drain region 18 of the access nFET 11' and the drain region 19 of the storage pFET 13' are interconnected by the common, floating, drain contact 24'(D), that comprises a node which is also floating in that, as stated above, it also is not connected to any external line.

Referring to FIG. 2A, the CMOS EPROM cell 100 is formed, as in FIG. 1A, on a substrate 12 preferably composed of silicon, with a Buried Oxide (BOX) layer 14 formed on the top surface thereof. A left isolation oxide region 15L is formed over the BOX layer 14 on the left edge of the device 100; and a right isolation oxide region 15R is formed over the BOX layer 14 on the right edge of the device 100. An SOI layer is composed of several doped regions 16, 17, 18, 19, 20 and 21 which are formed over the BOX layer 14 between the left isolation oxide region 15L and the right isolation oxide region 15R. The access nFET 11' is composed of an n+ doped source region 16, a p doped channel region 17, and an n+ doped drain region 18, that are formed directly on the top surface of the BOX layer 14 adjacent to the left isolation oxide region 15L. The pFET 13' is composed of p+ doped drain region 19, an n doped channel region 20 and a p+ doped source region 21, which are also formed directly on the top surface of the BOX layer 14, located between the n+ drain region 18 of the nFET 11' and the right isolation oxide region 15R.

The access nFET 11' includes a thin gate dielectric layer 23 formed over a p doped channel region 17 and a gate electrode G1, which is electrically conductive, located above the thin gate dielectric layer 23. The thin gate dielectric layer 23, which may be composed of silicon oxide (gate oxide) or other conventional gate dielectric materials, is thin, as is conventional, since the speed of an FET device is enhanced by having a thin gate dielectric layer.

The storage pFET 13' includes a thick gate dielectric layer 25F formed over the n doped channel region 20, and an electrically conductive, floating gate electrode FG2 located above the thick gate dielectric layer 25F. The thick gate dielectric layer 25F, which is substantially thicker than the thin gate dielectric layer 23, may be composed of silicon oxide (gate oxide) or other suitable gate dielectric materials, as will be well understood by those skilled in the art. For the most advanced CMOS device being manufactured contemporarily, the thin gate oxide layer 23 of the access nFET 11' can be as thin as about 1 nm thick. The thick gate dielectric 25F must be far thicker than the thin gate oxide layer 23 to prevent unwanted tunneling from discharging the charge stored in the floating gate electrode FG2, with a thickness of from about 8 nm to about 10 nm, as contrasted with a thin 1 nm thick gate oxide layer 23, i.e. nearly an order of magnitude thicker.

The gate electrode G1 of the access nFET 11' is connected to a WL0 word line 28A. The source contact 26(S) of the storage pFET 13' is connected to a BL1 bitline 26BL. The source contact 22(S) of the access nFET 11' is connected to the SL0 select line 22SL. However, the floating gate electrode FG2 is not connected externally.

Referring to FIGS. 2A and 2C, the access nFET 11' and the storage pFET 13', which are connected in a memory array 200 (shown in FIG. 2C), are operated by signals from a SL0 select line 22SL, a WL0 word line 28A, a BL1 bit line 26BL of the memory array 200. In operation, the EPROM cell 100, which comprises a CMOS device formed on a silicon substrate 12, is different from the inverter 10 of FIG. 1A in that the SL select line 22SL, the WL0 word line 28A and the BL1 bit line 26BL function quite differently from the lines connected to the inverter 10 of FIG. 1A. The memory cell 100 of FIG. 2A has the first silicided contact region 22(S) and thus the source of the access nFET 11' connected by the SL0 select line 22SL of the memory array 200 to receive the select voltage $V_{SL}$. The gate electrode G1 of the access nFET of cell 100 is connected to the WL0 wordline 28A of the memory array. The source of the pFET 13' is connected to the BL1 bitline 26BL of the memory array 200, and the floating gate electrode FG2 of the storage pFET 13' is left floating. The electrically-shorted node 24'(D) representing both the drain of the access nFET 11' and drain of the storage pFET 13' is left floating, as well.

Referring in more detail to features shown in FIG. 2A the CMOS EPROM cell 100 comprises an access nFET 11' and a storage pFET 13'. The cell 100 is formed on a substrate 12, preferably composed of silicon, with a Buried Oxide (BOX) layer 14 formed on the top surface thereof. A left isolation oxide region 15L is formed over the BOX layer 14 on the left edge of the device 100; and a right isolation oxide region 15R is formed over the BOX layer 14 on the right edge of the device 100. As described with reference to FIG. 1A, on top surface of the BOX layer 14 are a left isolation oxide region 15L, and a right isolation oxide region 15R with an SOI layer therebetween composed of doped regions 16, 17, 18, 19, 20 and 21. The SOI layer is formed over the BOX layer 14 between the right edge of the left isolation oxide region 15L and the left edge of the right isolation oxide region 15R. The access nFET 11' is composed of an n+ doped source region 16 juxtaposed with the right edge of the left isolation oxide region 15L, a p doped channel region 17 (to the right of n+ doped source region 16) and an n+ drain region 18 (adjacent thereto), which are formed on the top surface of the BOX layer 14. The storage pFET 13', which is formed on the top surface of the BOX layer 14, is located between the n+ drain region 18, and the right isolation oxide region 15R; and the storage pFET 13' is composed of p+ doped drain region 19 juxtaposed with the n+ drain region 18, an n doped channel region 20 (to the right of the p+ drain region 19,) and a p+ source region 21 (adjacent thereto and next to the left edge of the right isolation oxide region 15R.)

As in FIG. 1A, the access nFET 11', which includes a thin gate dielectric (gate oxide) layer 23 formed over the p doped channel region 17 of the access nFET 11', and an electrically conductive first gate electrode G1, is formed on the top surface of the thin gate dielectric layer 23.

The storage pFET 13' includes a floating gate dielectric (silicon oxide) layer 25F, which is thicker than the gate dielectric layer 25 of FIG. 1A is formed over the n doped channel region 20 of the storage pFET 13'. The thick gate dielectric layer 25F must be thicker than the thin gate dielectric layer 23 to prevent leakage of charge stored on a floating gate electrode FG2 by unwanted tunneling of charge therethrough. The floating gate electrode FG2, located above the thick gate dielectric layer 25F, is also electrically conductive. A first silicided contact 22, formed on the top surface of the source region 16 of the access nFET 11', is connected to the select line SL0 of the memory array of FIG. 2C by a source line 22SL. A second silicided contact 24' (D) is formed on the combined top surfaces of both the drain region 18 of the access nFET 11' and the drain region 19 of the storage pFET 13'. The second silicided contact 24' (D) short circuits the floating drains regions 18 and 19 together. A third silicided contact 26, which is formed on the top surface of the source region 21 of the storage pFET 13', is connected to the BL1 bit line 26BL of the memory array 200. The first silicided contact region 22 and the second silicided contact region 24' are spaced away from the gate electrode G1, and the second and third silicided contact regions. 24' and 26 are spaced away from the floating gate electrode FG2.

Referring to both FIGS. 2A and 2B, the first silicided contact 22SL connects potential $V_{SL0}$, to the source region 16 of the access nFET 11'. The gate electrode G1 is connected by line 28A to the wordline WL0. As stated above, there is no connection to the floating gate electrode FG2, so the gate electrode G1 is not electrically connected to the floating gate electrode FG2, unlike the inverter 10 of FIG. 1A. As stated above, the second silicided contact 24' (D) is floating, i.e. is not connected to any output terminal unlike FIG. 1A The third silicided contact 26 is connected to the bit line BL, unlike FIG. 1A.

To program the memory cell, a large programming voltage Vpp=$V_{BL1}$ is applied to the bitline 26BL and the access nFET 11' is turned on with a positive wordline voltage $V_{WL0}$ on wordline WL. The select line 22SL is connected to ground or 0 V, causing Vpp to be dropped between the source region 21 and the drain region 19 of the storage pFET 13'. The large programming voltage causes avalanche impact ionization to occur near the drain end of the storage pFET 13', causing secondary hot electrons to be injected into the floating gate electrode FG2. As a hot electron current is generated by the injection of those secondary hot electrons into the floating gate electrode FG2, the storage pFET 13' begins to turn ON.

As the storage pFET turns ON, at first the hot electron current increases as the current in the channel region 20 of the storage pFET 13' increases, and then the hot electron current begins to decrease once the floating gate FG2 is charged to the equivalent of about 0.4 V above the threshold voltage of the storage pFET 13'. Another factor, which causes the hot electron current to decrease subsequent to reaching a peak value, is the fact that as the storage pFET 13' is turned on more and more, the source-to-drain voltage of the access nFET 11' becomes larger and as a result the source-to-drain voltage (Vds) of the storage pFET 13' becomes smaller, thus reducing the degree of avalanche impact ionization in the storage pFET 13'.

Figure 3:
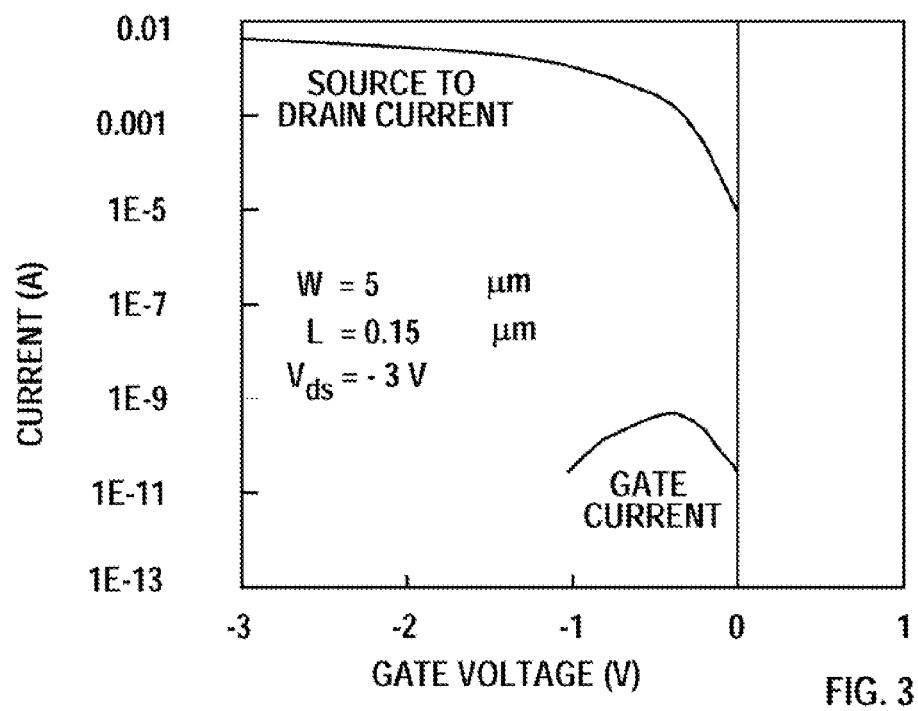
FIG. 3 is a graph of gate current in amperes vs gate voltage which shows source-to-drain current and the hot electron injection current for a typical floating gate storage pFET, which was measured at a fixed value of drain to source voltage (Vds) for a 65-nm generation CMOS device.

FIG. 3 is a graph of gate current in amperes vs gate voltage which shows source-to-drain current and the hot electron injection current for a typical floating gate storage pFET 13' measured at a fixed value of drain to source voltage (Vds) for a 65-nm generation CMOS device.

The memory cell 100 of FIGS. 2A, 2B and 2C can be read by applying, e.g. supply voltage Vdd, to both the BL1 bitline 26BL and to the WL0 wordline 28A. As an EPROM or program-once memory device, there is no electron storage in the floating gate FG2 until the memory device 100 has been programmed. On the one hand, if the storage pFET 13' in the memory cell 100 is non-programmed (i.e. is in the OFF state) there is negligible current flowing in the bitline 26BL. When the memory cell 100 is in the non-programmed state, the higher the threshold voltage of the storage pFET 13', the smaller the bitline current on line 26BL. On the other hand, if the memory cell 100 has been programmed, there is significant quantity of electrons stored on the floating gate electrode FG2. Those stored electrons turn ON the storage pFET 13', thereby causing current to flow in the bitline 26BL. The larger the amount the electrons stored on the floating gate electrode FG2, the larger the bitline current in the bitline 26BL of the memory cell 100 when it is programmed.

Second Embodiment: SOI EEPROM

Figure 4A:
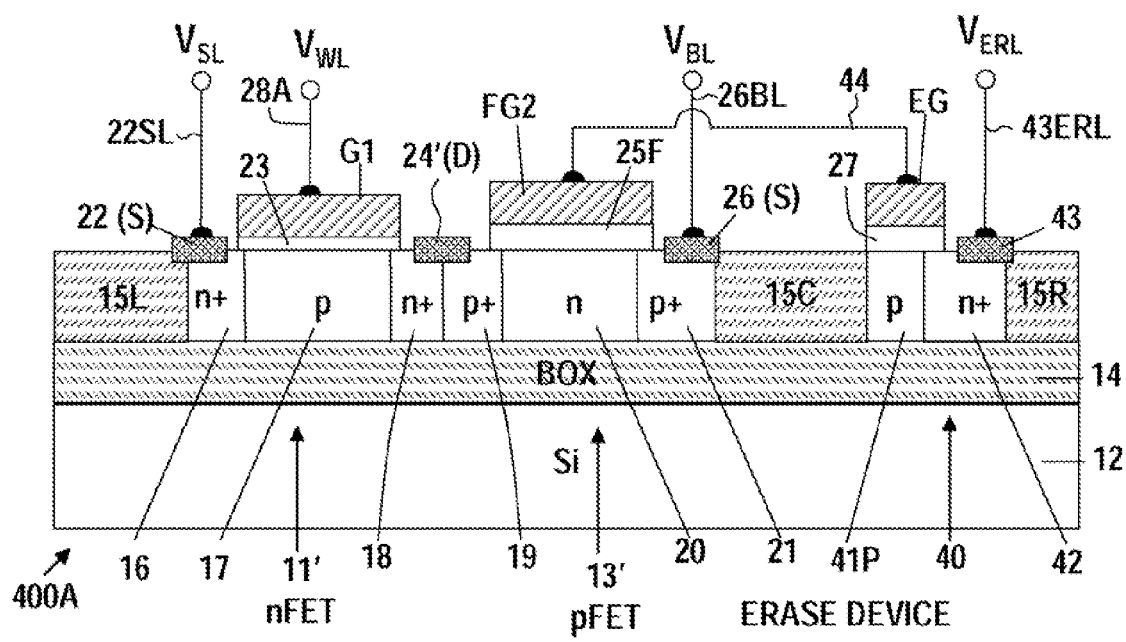
FIG. 4A shows an embodiment comprising a CMOS non-volatile EEPROM cell in accordance with this invention, which is a modification of the EPROM cell of FIG. 2A incorporating a third isolation oxide region on the top surface of the BOX layer, which includes an erase device.

FIG. 4A shows an embodiment comprising a CMOS non-volatile EEPROM cell 400A in accordance with this invention, that is a modification of the EPROM cell 100 of FIG. 2A, which includes an erase device 40 and incorporates a third isolation oxide region 15C on the top surface of the BOX layer 14, is located to the right of the p+ doped source region of the storage pFET 13'. The third isolation oxide region 15C is juxtaposed with the erase device 40 which has an erase gate electrode EG that is electrically connected by an electrical conductor line 44 to the floating gate electrode FG2.

The erase device 40 can be simply one half of an FET with a second thick gate dielectric layer 27 substantially equal in thickness to the thick gate dielectric 25F of the pFET 13'. The erase device 40 includes a p doped region 41P and an n+ doped region 42 formed in the SOI layer on the top surface of the BOX layer 14. The p doped region 41P is juxtaposed with the right edge of the third isolation oxide region 15C. The n+ doped region 42 is located to the right of the p doped region 41P and on the other side is juxtaposed with the left edge of the right isolation oxide region 15R. The second thick gate dielectric layer 27 is formed above the p doped region 41P and a portion of the n+ doped region 42 with the erase gate electrode EG formed on the top surface thereof with the erase gate electrode EG overlapping the gate-edge-defined n-type diffusion region 42. An erase gate silicided contact 43 is formed over a portion of the n+ doped region 42 and is spaced away from the erase gate electrode EG. In summary, in FIG. 4A the erase device 40 includes the p doped region 41P, the n+ doped region 42 formed in the SOI layer, the second thick gate dielectric layer 27 formed above the p doped region 41P and the n+ doped region 42 i.e. the erase gate electrode EG is formed over the second thick gate dielectric layer 27. As shown in FIG. 4A, the region 41P underneath the erase gate electrode EG can be p-type, just as in an n-channel FET.

The memory device can be erased by applying a large positive voltage to the erase line 43ERL to cause electrons in the floating gate electrode to tunnel out to the erase-line electrode. Since there is an access transistor 11' in the memory cell 400A, there is no concern of over-erasure.

In the EEPROM cell 400A, the erase gate electrode EG is also floating since neither the erase gate electrode EG nor the floating gate electrode FG2 is connected to an external terminal. While the cell 400A is otherwise identical in structure to the cell 100 of FIG. 2A, the access nFET access transistor 11' can be a regular high-performance logic transistor. The SOI CMOS cell 400A has a significant density advantage over a bulk CMOS version.

Figure 4B:
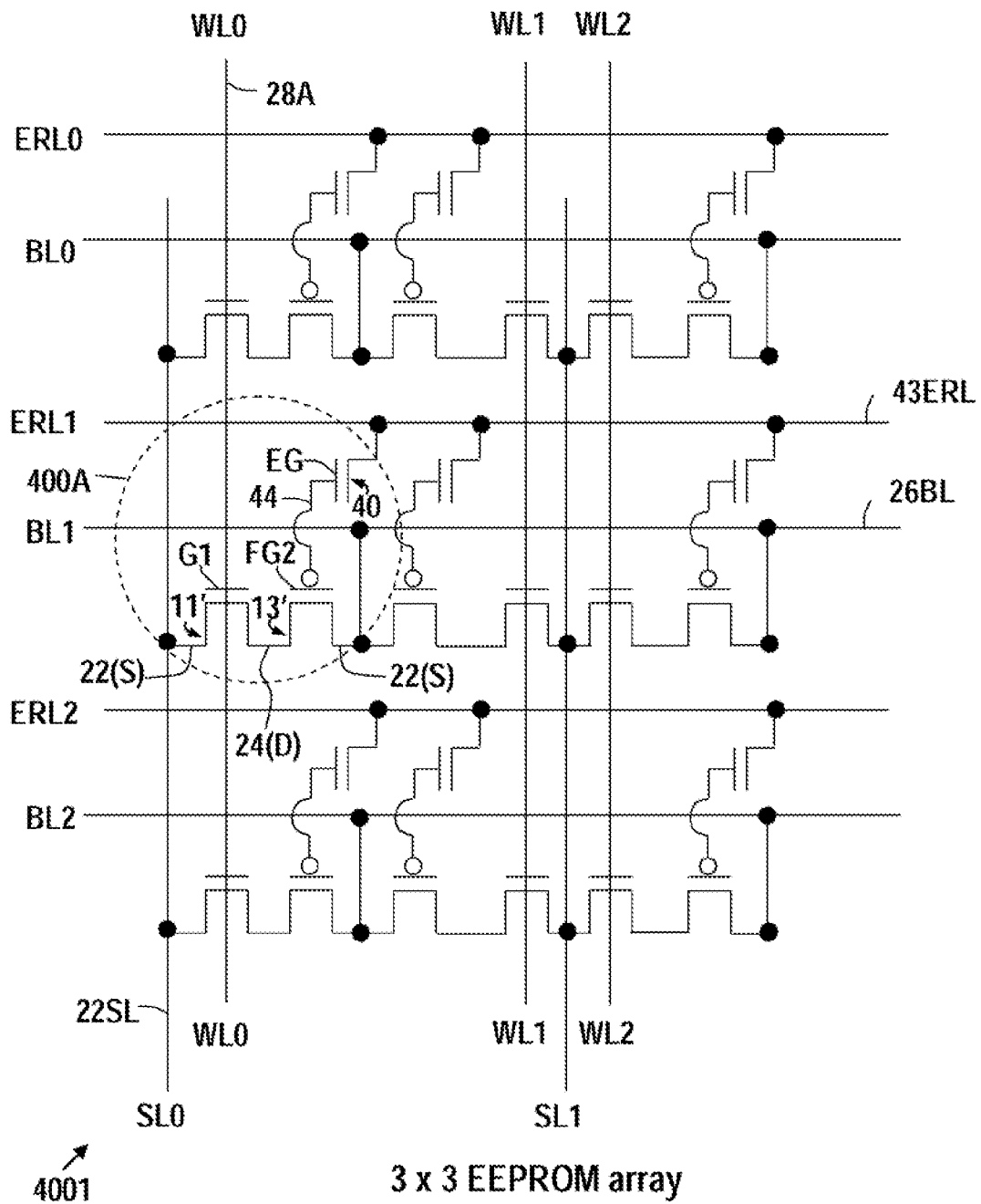
FIG. 4B shows a 3-x-3 EPROM array including the EEPROM cell of FIG. 4A with the access nFET and the storage pFET thereof connected in the array.

FIG. 4B shows a 3-×-3 EEPROM array 4001 including the EEPROM cell 400A of FIG. 4A with the access nFET 11' and the storage nFET 13' connected in the EEPROM array 4001. The EEPROM array 4001 includes three word lines WL0, WL1, WL2, three bitlines BL0, BL1, BL2, and two select lines SL0, SL1. The gate electrode G1 of the access nFET 11' is connected to a WL0 word line 28A; and the source contact 22(S) of the access nFET 11' is connected to the SL0 select line 22SL. The source contact 26(S) of the storage pFET 13' is connected to the BL1 bitline 26BL; and the floating gate electrode FG2 of the storage pFET 13' is floating, i.e. not connected to any external line. Referring to FIGS. 2A, 2B, and 2C, the drain region 18 of the access nFET 11' and the drain region 19 of the storage pFET 13' are interconnected by the common, floating, drain contact 24' (D), that comprises a node which is also floating in that, as stated above, it also is not connected to any external line.

Third Embodiment: SOI EEPROM

Figure 4C:
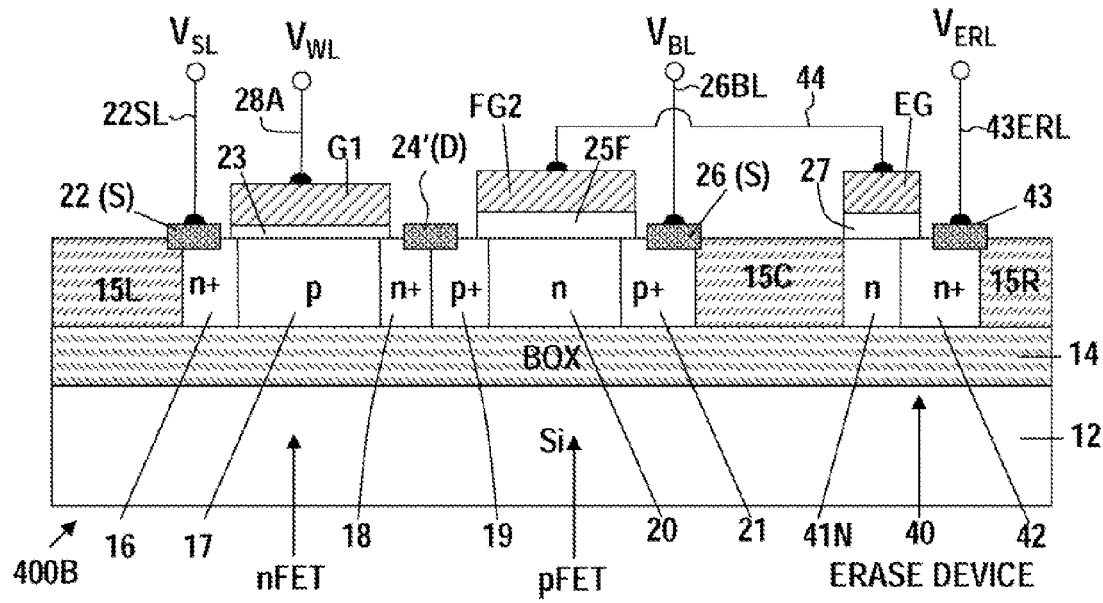
FIG. 4C shows a CMOS non-volatile EEPROM cell in accordance with this invention, which is a modification of the EEPROM cell of FIG. 4A in which the p-doped region of FIG. 4A, under the erase gate electrode has been replaced by an n-doped region to increase the overlap of the erase gate with an n-type region and an n+ doped region of the erase device.

FIG. 4C shows a CMOS non-volatile EEPROM cell 400B in accordance with this invention, which is a modification of the EEPROM cell 400A of FIG. 4A. In FIG. 4C, the p-doped region 41P of FIG. 4A, under the erase gate electrode EG, has been replaced by an n-doped region 41N to increase the overlap of the erase gate EG with the n-type region 41N and n+ doped region 42.

Fourth Embodiment: SOI EEPROM

Figure 4D:
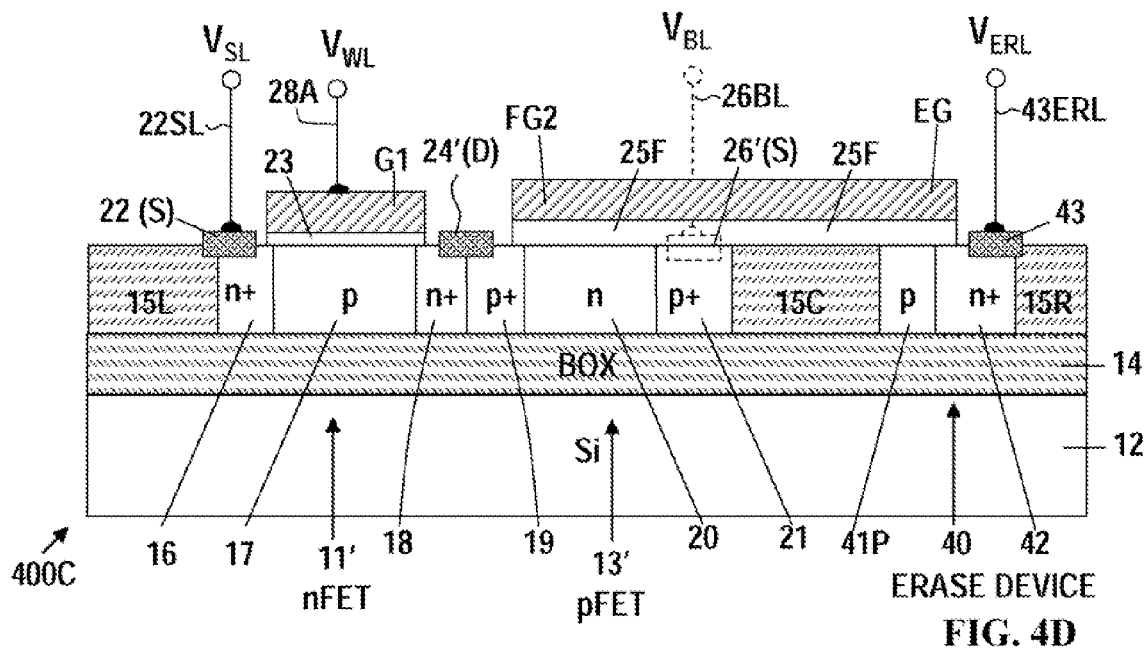
FIG. 4D shows a CMOS non-volatile EEPROM cell in accordance with this invention, which is a modification of the EEPROM cell of FIG. 4A with the floating gate electrode extended far to the right over the p-doped region to serve the erase gate function for the erase device of the cell.

FIG. 4D shows a CMOS non-volatile EEPROM cell 400C in accordance with this invention, which is a modification of the EEPROM cell 400A of FIG. 4A with the floating gate electrode FG2 of FIG. 4A extended far to the right over the p-doped region 41P to serve the erase gate function for the erase device 40. That is to say that the floating gate electrode FG2 is directly connected to and integral with the erase gate electrode EG of the device 40. It should be noted that the floating gate electrode FG2 does not run directly above the p+ doped region 21, as the p+ doped region 21 is usually introduced by an ion implantation that is self-aligned to the edge of the floating gate FG2.

Fifth Embodiment: SOI EEPROM

Figure 4E:
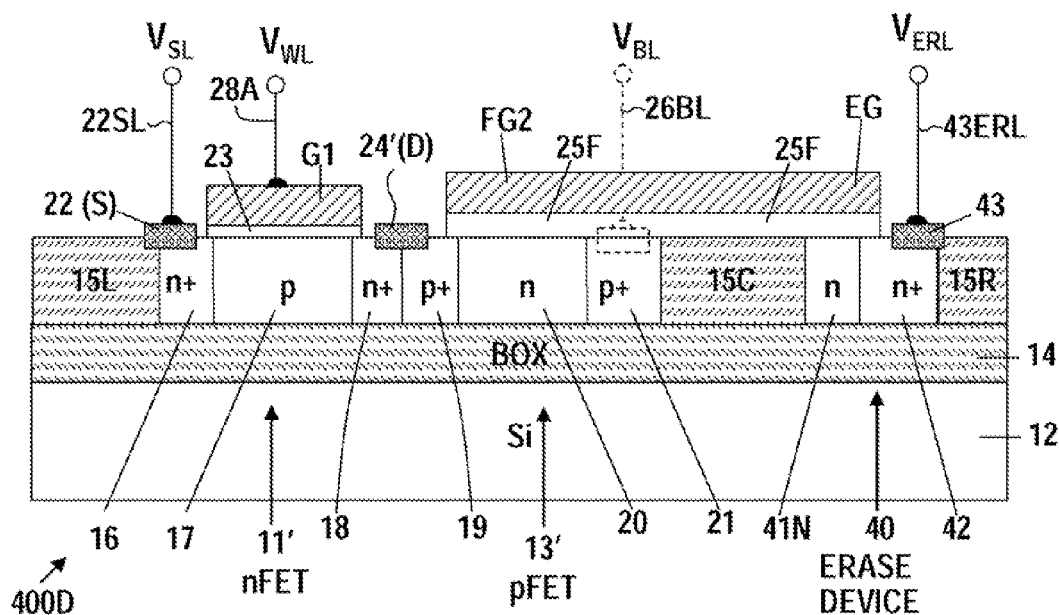
FIG. 4E shows a CMOS non-volatile EEPROM cell in accordance with this invention, which is a modification of the EEPROM cell of FIG. 4C in which the floating gate electrode of FIG. 4C has been extended far to the right over an n doped region and a portion of an n+ region of the erase gate.

FIG. 4E shows a CMOS non-volatile EEPROM cell 400D in accordance with this invention, which is a modification of the EEPROM cell 400B of FIG. 4C. In FIG. 4E the floating gate electrode FG2 of FIG. 4C has been extended far to the right over the n doped region 41N and a portion of the n+ region 42 of the erase device 40.

The typical voltages used to operate such an EEPROM memory cell in sub-100 nm CMOS technology are shown in Table II below, with Vdd as the CMOS power supply, which is typically approximately 1.0 V.

TABLE II

| Operation | $V_{SL}$ | $V_{WL}$ | $V_{BL}$ | $V_{EL}$ |
|---|---|---|---|---|
| Program | 0 V | $V_{dd}$ | $\geqq 3$ V | 0 V |
| Read | 0 V | $V_{dd}$ | $V_{dd}$ | 0 V |
| Erase | 0 V | $V_{dd}$ | 0 V | >3 V |

Sixth Embodiment: Bulk EPROM

Figure 5A:
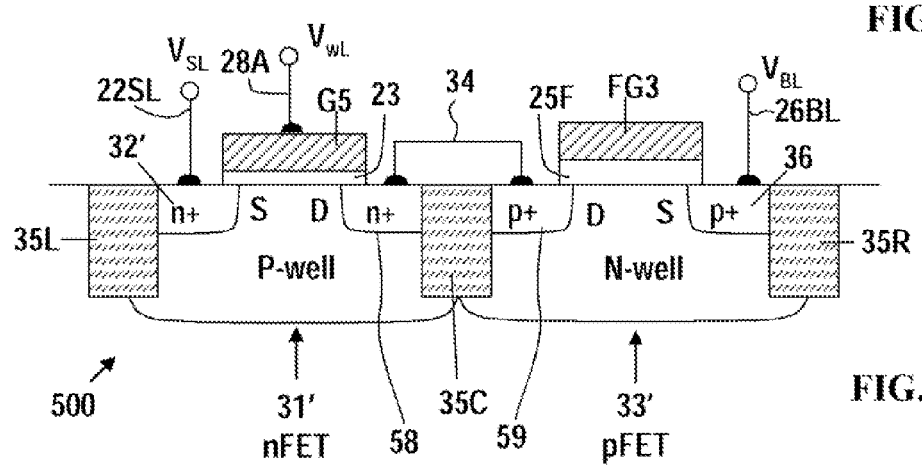
FIG. 5A is a schematic diagram of a cross section of a CMOS EPROM cell in accordance with this invention implemented in a bulk CMOS embodiment with an access nFET and a storage pFET.

FIG. 5A is a schematic diagram of a cross section of a bulk CMOS EPROM cell 500 in accordance with this invention implemented in a bulk CMOS embodiment with an access nFET 31' and storage pFET 33'. The cell 500 includes a left isolation oxide region 35L, a central isolation oxide region 35C and a right isolation oxide region 35R. A P-well is located between the left isolation oxide region 35L and the central isolation oxide region 35C. An N-well is located between the central isolation oxide region 35C and the right isolation oxide region 35R.

The nFET 31', which is formed in the P-well includes a n+ doped source region 32' formed adjacent to the left isolation oxide region 35L juxtaposed with an n-FET channel region in the P-well and a n+ doped drain region 58 formed next to the n-FET channel region and adjacent to the central isolation oxide region 35C, with a thin gate dielectric layer 23 formed above the n-FET channel region, and a gate electrode G5 formed thereabove.

The storage pFET 33', which is formed in the N-well including a p+ doped drain region 59 formed adjacent to the central isolation oxide region 35C juxtaposed with a p-FET channel region in the N-well, and a p+ doped source region 36 formed next to the p-FET channel region and adjacent to the right isolation oxide region 35R with a thick gate dielectric layer 25F formed above the p-FET channel region, and a floating gate electrode FG3 formed thereabove.

The n+ source region 32' of the nFET 31' is connected by line 22SL to the select voltage $V_{SL}$, the gate G5 of the select nFET 31' is connected by the word line 28A to the voltage $V_{WL}$, and the p+ source region 36 is connected by line 26BL to the bit line voltage $V_{BL}$, and the line 34 interconnects the drains 58 and 59. The storage gate FG3, the line 34, as well as the drains 58 and 59 are floating.

Figure 5B:
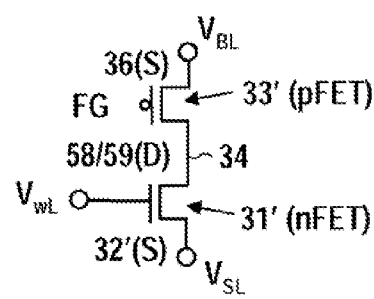
FIG. 5B is an electrical circuit schematic diagram of the device of FIG. 5A.

FIG. 5B is an electrical circuit schematic diagram of the device of FIG. 5A.

Seventh Embodiment: Bulk EEPROM

Figure 6:
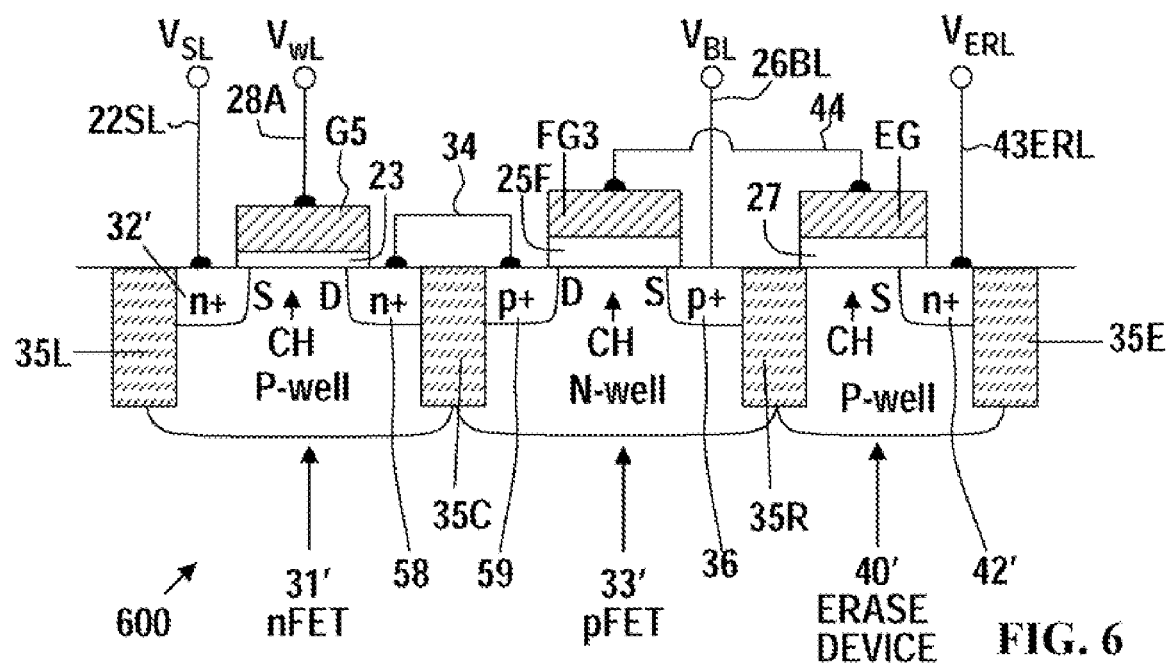
FIG. 6 is a schematic diagram of a cross section of a bulk CMOS EEPROM cell in accordance with this invention which is a modification of the CMOS EPROM of FIG. 5A, which adds an erase device to the access nFET, and the storage pFET of the CMOS EPROM of FIG. 5A

FIG. 6 is a schematic diagram of a cross section of a bulk CMOS EEPROM cell 600 in accordance with this invention which is a modification of FIG. 5A, in that an erase device 40' has been added to the access nFET 31' and the storage pFET 33', wherein like elements with like indicia have like functions and identities. The EEPROM cell 600 includes an erase device 40' which is similar to the erase device 40 of FIG. 4A which includes an erase gate electrode EG formed over a thick gate dielectric layer 27 which is formed over a right P-well and overlapping an n+ doped region 42'.

In more detail, the EEPROM cell 600 includes a left isolation oxide region 35L, a central isolation oxide region 35C to the right thereof, a right isolation oxide region 35R juxtaposed therewith, and an extra isolation region 35E farther to the right. A left P-well is located between the left isolation oxide region 35L and the central isolation oxide region 35C. A central N-well is located between the central isolation oxide region 35C and the right isolation oxide region 35R. A right P-well for the erase device 40' is located between the right isolation oxide region 35R and the extra isolation oxide region 35E farther to the right.

The erase device 40' of EEPROM 600 comprises one half of an n-FET including the right P-well with a p doped channel region and n+ doped region 42' formed in the P-well, the thick gate dielectric layer 27 for the erase gate EG (formed over the p-doped region and a portion of the n+ doped region 42'). The erase gate electrode EG is formed over the thick gate dielectric layer 27. The thick gate dielectric layer 27 is substantially equal in thickness to the thick gate dielectric 25F of the storage pFET 33'.

The n+ doped region 42' is located on the right side in the top surface of the second P-well juxtaposed with the left edge of the extra isolation oxide region 35E. The thick gate dielectric layer 27 is on the top surface of the P-well and reaches only slightly across a portion of the n+ doped region 42'. The erase gate electrode EG is formed on the top surface of thick gate dielectric layer 27, with the erase gate electrode EG overlapping the gate-edge-defined n-type diffusion region 42'. An erase gate contact 43 is formed in and on the top surface of the n+ doped region 42' and is spaced away from the erase gate electrode EG.

In FIG. 6, the cell areas are significantly larger because of the large area of the left isolation oxide region 35L, central isolation oxide region 35C and right isolation oxide region 35R, and extra isolation oxide region 35E, required for isolating the p-well and the n-well, etc. To reduce cell area in bulk CMOS implementation, designers usually use a p-FET, instead of an n-FET, for the access transistor. An implementation of such an all p-FET bulk CMOS is described in prior art U.S. Pat. No. 6,678,190 of Yang entitled "Single Poly Embedded EPROM" and U.S. Pat. No. 6,711,064 of Hsu entitled "Single-Poly EPROM". However, using an nFET transistor compared to a pFET access transistor results in faster memory device operation because an nFET is about twice as fast as a pFET.

The CMOS non-volatile memory devices of this invention functions like a CMOS inverter. Therefore, such CMOS non-volatile memory devices can be easily adapted to function as a programmable CMOS logic circuit. Since an inverter is the basic building block for logic circuits, the adaptation of a CMOS non-volatile memory device to function as a programmable CMOS inverter is described next.

In FIGS. 2B and 5B, which are circuit representations for the EPROM devices of the present invention, the drain node 24' (D) is floating and is not used as an electrical signal. However, as shown in FIG. 7A, if the drain node voltage on drain node 24' is taken as an output voltage $V_{OUT}$; and the access device gate voltage is taken as an input voltage, then we have a programmable CMOS inverters which are describe below.

Eighth Embodiment: SOI Programmable CMOS Floating Gate Inverter

Figure 7A:
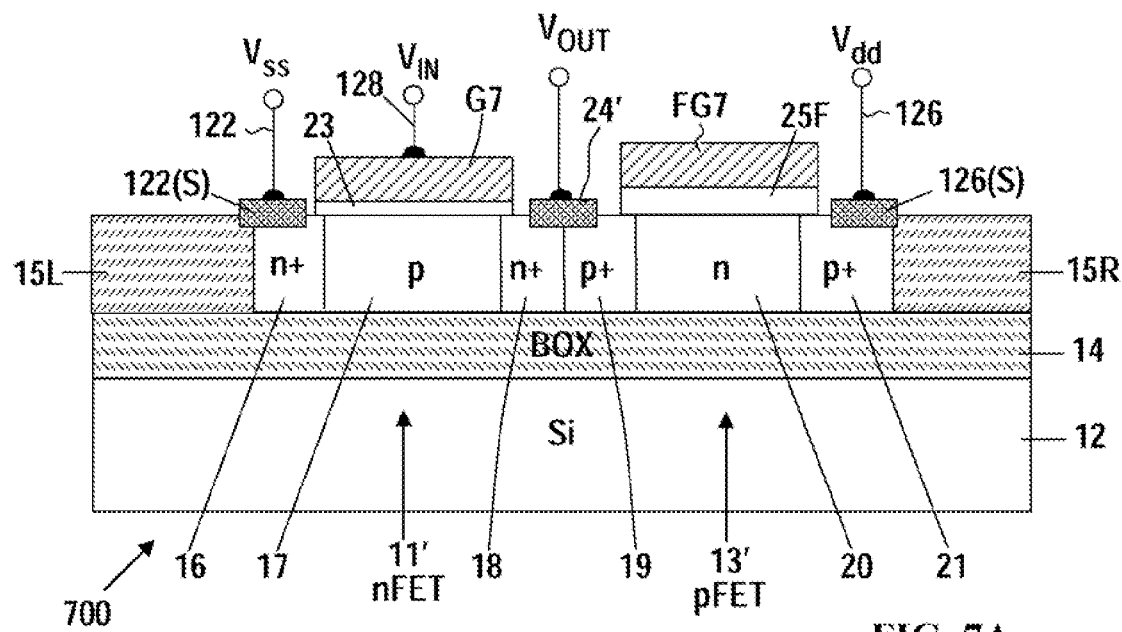
FIG. 7A shows a schematic cross section diagram for an SOI embodiment of a programmable CMOS inverter in accordance with this invention.
Figure 7B:
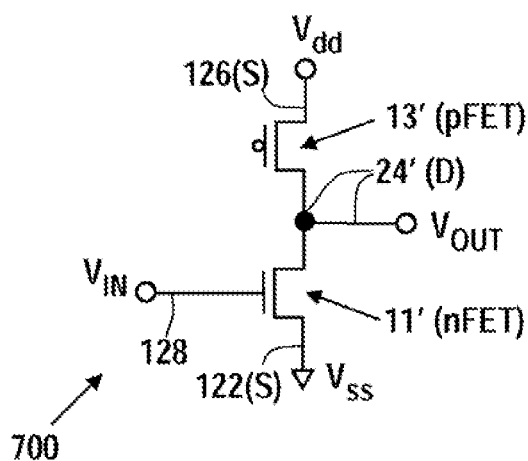
FIG. 7B is an electrical circuit schematic diagram of the inverter of FIG. 7A.
Figure 7C:
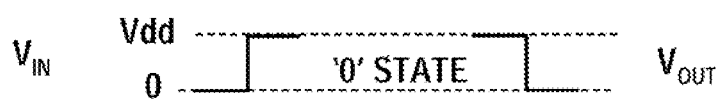
FIG. 7C is a voltage trace of the inverter of FIG. 7A in the "0" state.
Figure 7D:
FIG. 7D is a voltage trace of the inverter of FIG. 7A in the "1" state.
Figure 7E:
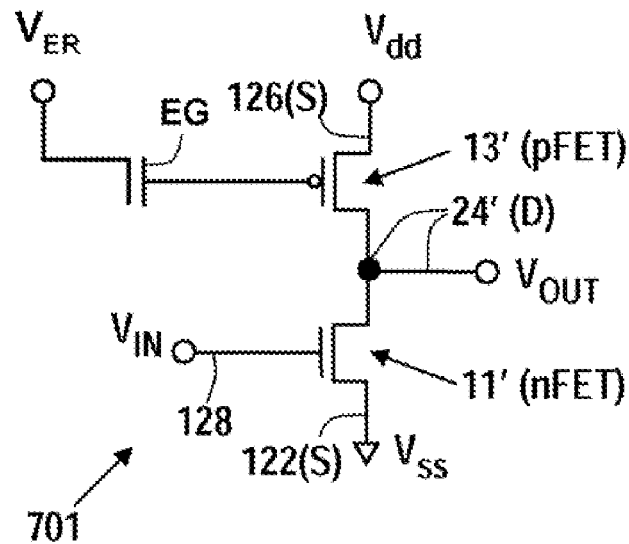
FIG. 7E is an electrical circuit schematic diagram of an erasable programmable inverter, which is a reprogrammable modification of the inverter of FIG. 7A.

FIG. 7A shows the schematic cross section diagram for an SOI embodiment of a programmable CMOS inverter 700. FIG. 7B is an electrical circuit schematic diagram of the inverter 700 of FIG. 7A. FIG. 7C is a voltage trace of the inverter 700 of FIG. 7A in the "0" state. FIG. 7D is a voltage trace of the inverter 700 of FIG. 7A in the "1" state. FIG. 7E is an electrical circuit schematic diagram of a programmable inverter 701 which is a modification of the inverter 700 of FIG. 7A, which can be reprogrammed.

Figure 7F:
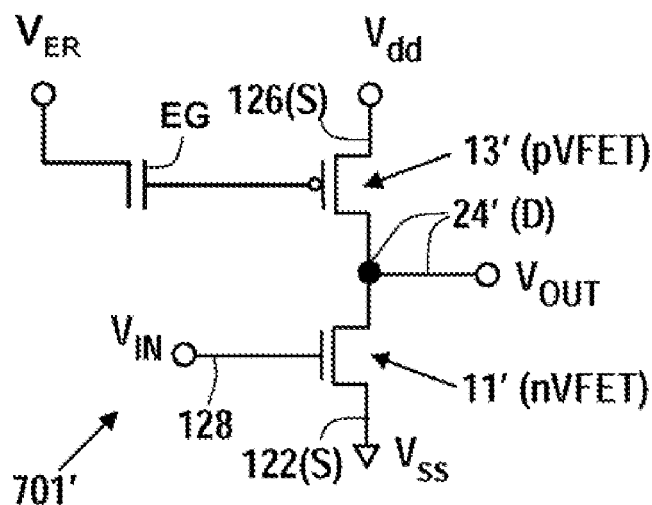
FIG. 7F shows a vertical FET embodiment of a reprogrammable modification of the inverter of FIG. 7A.

FIG. 7F shows a vertical FET embodiment 701' of a reprogrammable modification of the inverter of FIG. 7A.

Figure 7G:
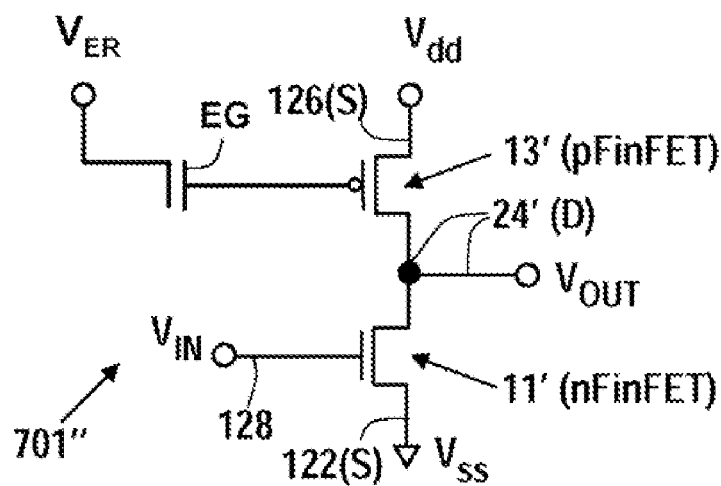
FIG. 7G shows a FinFET embodiment of a reprogrammable modification of the inverter of FIG. 7A.

FIG. 7G shows a FinFET embodiment 701' of a reprogrammable modification of the inverter of FIG. 7A. A discussion of vertical FETs and FinFETs and other embodiments thereof is included below.

The physical structure of the programmable CMOS inverter 700 of FIG. 7A, which includes a programmable floating-gate electrode storage pFET 13' and a regular access nFET 11' in series, is identical to the proposed CMOS EPROM cell 100 of FIG. 2A. The contact 122(S) is connected to line 122 which applies reference voltage $V_{ss}$, i.e. ground voltage, which equals zero Volts, to the source region 16 of the nFET 11'. The gate electrode G7 of nFET 11' is connected by line 128 to an input terminal $V_{IN}$. The second silicided contact 24' connects p+ doped drain region 19 of pFET 13' and n+ doped drain region 18 of nFET 11' to an output potential terminal $V_{OUT}$. The third silicided contact 126(S) connects p+ source region 21 of pFET 13' to a power supply terminal $V_{dd}$. The floating gate FG7 is not connected to an external line similarly to the floating gate FG2 of FIG. 2A. The programmable CMOS inverter 700 can be programmed using the same scheme used with the EPROM 100 of FIG. 2A. In the '0' state (or before programming), no electrons are stored in the floating gate electrode FG7 and the storage pFET 13' is in the off-state and has high resistance. In the '1' state after programming, electrons are stored in the floating gate electrode FG7 and the storage pFET 13' is turned on and has low resistance. For logic applications, the circuit is equivalent to an nFET switch with a programmable resistor load. In the '0' state, the circuit of the programmable CMOS inverter 700 simply behaves like an ordinary inverter. When the input voltage $V_{IN}$ switches from 0V to Vdd, the output switches from Vdd to 0V. In the '1' state, if the resistance of the storage pFET 13' is sufficiently lower than the resistance of the access nFET 11', the output voltage $V_{OUT}$ on contact 24' will stay close to Vdd when input switches from 0V to Vdd. Additional inverter stages can be added to fully restore the output voltage level, if necessary.

The programmable inverter 701 includes an erase gate EG added to the programmable inverter can be erased so that the inverter 701 is a electrically erasable and programmable.

Ninth Embodiment: Bulk Programmable CMOS Floating Gate Inverter

Figure 8A:
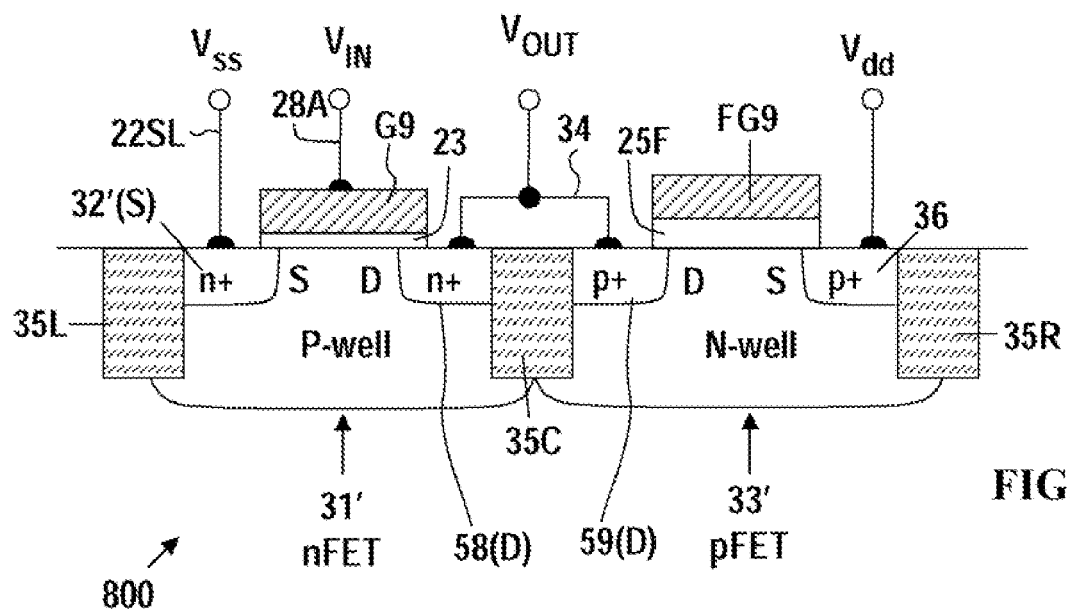
FIG. 8A shows the physical structure of a bulk embodiment of a programmable CMOS inverter in accordance with this invention, which is a modification of the EPROM device of FIG. 5A.
Figure 8B:
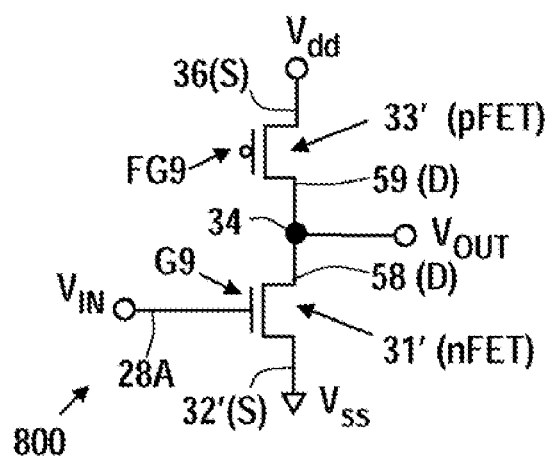
FIG. 8B is an electrical circuit schematic diagram of the inverter of FIG. 8A.
Figure 8C:
FIG. 8C is a voltage trace of the inverter of FIG. 8A in the "0" state.
Figure 8D:
FIG. 8D is a voltage trace of the inverter of FIG. 8A in the "1" state.
Figure 8E:
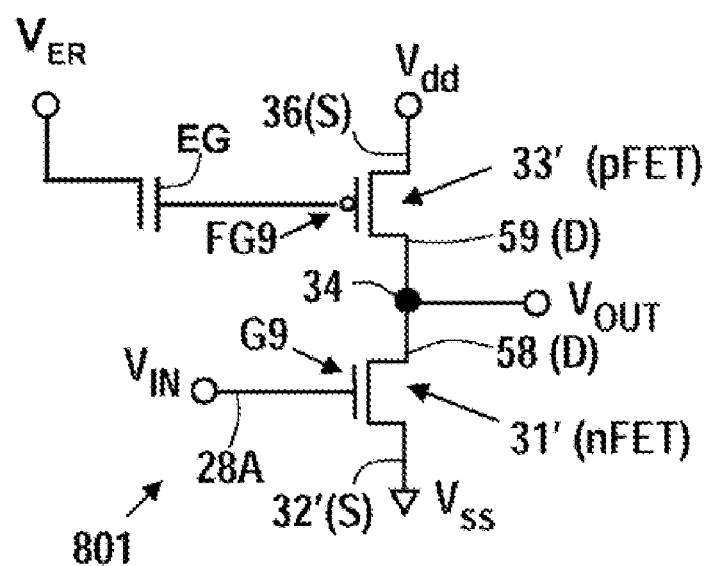
FIG. 8E is an electrical schematic diagram of an erasable and programmable inverter, which is a reprogrammable modification of the inverter of FIG. 8A.

FIG. 8A shows the physical structure of a bulk embodiment of a programmable CMOS inverter 800, which is a modification of the EPROM device 500 of FIG. 5A. In FIG. 8A the programmable CMOS inverter 800 is connected to voltages and operated in the same way as the programmable inverter 700 of FIGS. 7A and 7B. FIG. 8B is an electrical circuit schematic diagram of the inverter 800 of FIG. 8A. FIG. 8C is a voltage trace of the inverter 800 of FIG. 8A in the "0" state. FIG. 8D is a voltage trace of the inverter 800 of FIG. 8A in the "1" state. FIG. 8E is an electrical schematic diagram of programmable inverter 801 which is a modification of the inverter 800 of FIG. 8A in that it has an erase gate and hence is electrically erasable and can be reprogrammed.

In more detail, the inverter 800 includes a left isolation oxide region 35L, a central isolation oxide region 35C to the right thereof, a right isolation oxide region 35R juxtaposed therewith on the right edge of the inverter 800. A left P-well is located between the left isolation oxide region 35L and the central isolation oxide region 35C. A right N-well is located between the central isolation oxide region 35C and the right isolation oxide region 35R.

An access nFET 31', which is formed in the P-well includes a n+ doped source region 32' formed adjacent to the left isolation oxide region 35L juxtaposed with an n-FET channel region in the P-well and a n+ doped drain region 58 formed next to the n-FET channel region adjacent to the central isolation oxide region 35C, with a thin gate dielectric layer 23 formed above the n-FET channel region, and a gate electrode G9 formed thereabove. The storage pFET 33', which is formed in the N-well includes a p+ doped drain region 59 formed adjacent to the central isolation oxide region 35C juxtaposed with p-FET channel region in the N-well, and a p+ doped source region 36 formed next to the p-FET channel region adjacent to the right isolation oxide region 35R with a thick gate dielectric layer 25F formed above the p-FET channel, and a floating gate electrode FG9 formed thereabove.

The source 32' of the nFET 31' is connected by line 22SL to reference voltage $V_{SS}$, i.e. ground voltage, which equals zero Volts, the gate G9 of the nFET 31' is connected by the line 28A to the voltage $V_{IN}$ both the n+ drain 58 and p+drain 59 are connected by interconnecting line 34 to the output terminal $V_{OUT}$, and the p+ source region 36 is connected to the power supply voltage $V_{dd}$. The storage gate FG9 and the line 34 are floating.

If the floating-gate electrode storage pFET 33' is not programmed, i.e., when the floating gate electrode FG9 is not storing electrons, the floating-gate memory element is in the '0' state and the floating-gate storage pFET 33' is weakly conducting. When the input is low, the output is pull high by the weakly conducting storage pFET 33'; when the input is high, the nFET pulls down the output. This is shown in FIG. 8C.

If the floating-gate pFET FG9 is programmed, i.e., when the floating gate electrode is storing electrons, the floating-gate memory element is in the '1' state and the floating-gate pFET is strongly conducting. When the input is low, the output is pull high by the strongly conducting pFET; when the input is high, the output is kept high by the strongly conducting pFET. This is shown in FIG. 8D.

The programmable inverter 801 of FIG. 8E includes an erase gate EG added to the programmable inverter can be erased so that the inverter 801 is programmable, electrically erasable, and can be reprogrammed.

A detailed design example based on experimental data from a 65 nm CMOS technology is given below.

Figure 9:
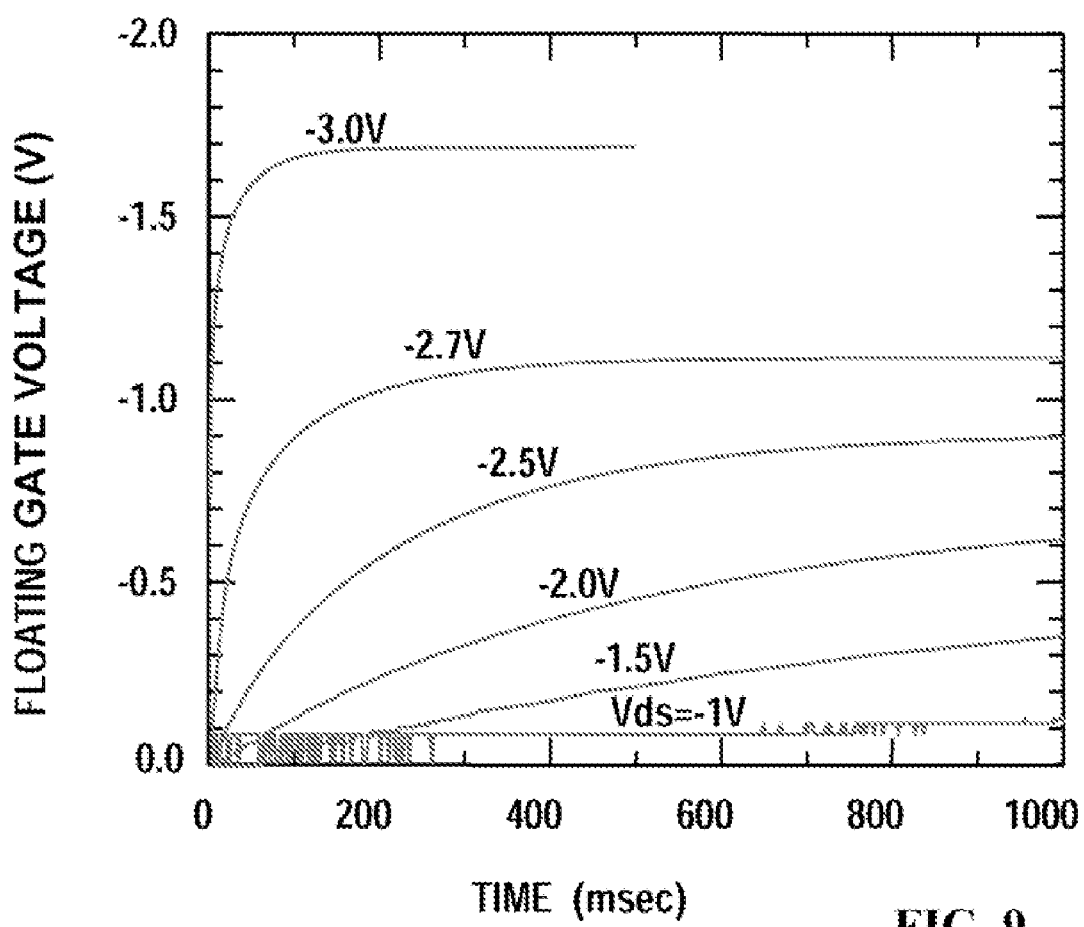
FIG. 9 shows measured floating gate electrode voltage shift (relative to the source voltage) of a pFET as a function of avalanche electron injection time.

FIG. 9 shows measured floating gate electrode voltage shift (relative to the source voltage) of a pFET as a function of avalanche electron injection time. With a voltage of 3V across the source and the drain, the floating gate electrode voltage changes from 0V to −1.65V due to the storage of injected electrons. This voltage is sufficiently low to turn-on the pFET which has a threshold voltage of −0.4V.

Assuming a 3V programming voltage, pFET resistance in the programmed state can be estimated as follows:

$$R=1/W(Rsd+L \cdot Rch) \quad (1)$$

where W is channel width and L is the channel length, Rsd is the parasitic source/drain series resistance and Rch is the channel sheet resistance. The channel sheet resistance Rch can be estimated from the floating gate electrode voltage in the programmed state:

$$Rch=(L/W) \cdot 1/(\mu Cox|Vg-Vt|) \quad (2)$$

where μ is the hole mobility, Cox is the gate oxide capacitance and Vg and Vt are floating gate electrode voltage and pFET threshold voltage respectively.

Typical numbers for a thick oxide pFET in a 65 nm technology are: L=0.1μ/m, Cox=12fF/μm², Rsd=400 Ohms and μ=100 cm²/Vsec.

In the programmed state, |Vg−Vt|=1.65V−0.4V=1.25V. The resulting Rch is ~7000 Ohm/square and R is 1100 Ohm for a 1 μm wide pFET.

For a CMOS programmable switch with a 1 μm wide nFET, the appropriate pFET width can be determined from the analysis in FIG. 10 which is described below.

Figure 10:
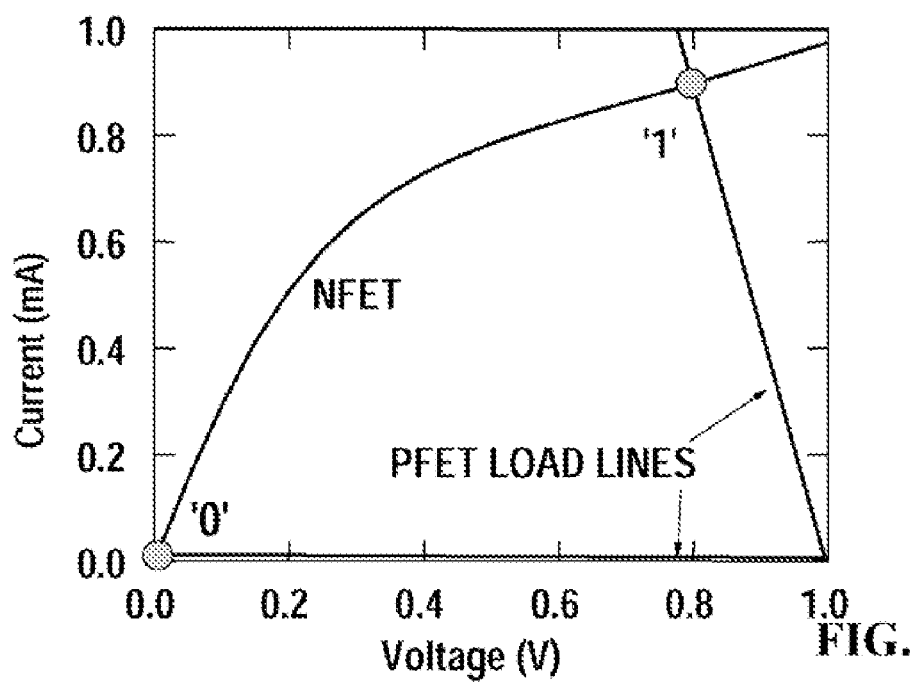
FIG. 10 shows a graphic method for estimating the output voltage levels for a CMOS programmable switch, including the measured thin oxide nFET output characteristics at Vgs=Vdd=1V.

FIG. 10 shows a graphic method for estimating the output voltage levels for a CMOS programmable switch, including the measured thin oxide nFET output characteristics at Vgs=Vdd=1V. This corresponds to an input voltage of Vdd. Two load lines are superimposed. The intersection of the nFET output characteristics and the pFET load line gives the output voltage level. The load line with a shallow slope corresponds to the pFET before programming that has high resistance. The load line with a steep slope corresponds to a programmed pFET with a resistance of 220 Ohm. The load line is selected to give an output level of 0.8V, to allow enough margins for a logic 'high' state. Therefore the appropriate pFET width is 1100 Ohm-μm/220 Ohm=5 μm.

The above analysis shows that a pFET and nFET width ratio of 5 to 1 in the proposed circuit provides the function of a programmable logic switch.

Figure 1B:
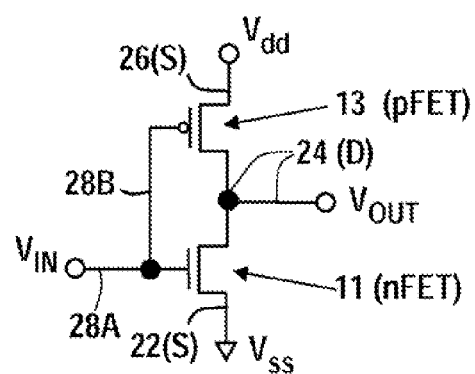
FIG. 1B is an electrical circuit schematic diagram of the device of FIG. 1A.
Figure 1C:
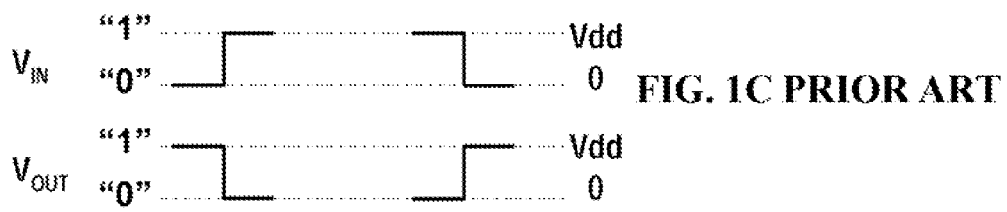
FIG. 1C shows the relationship between the input and output signals of the inverter circuit of FIG. 1B.
Figure 1D:
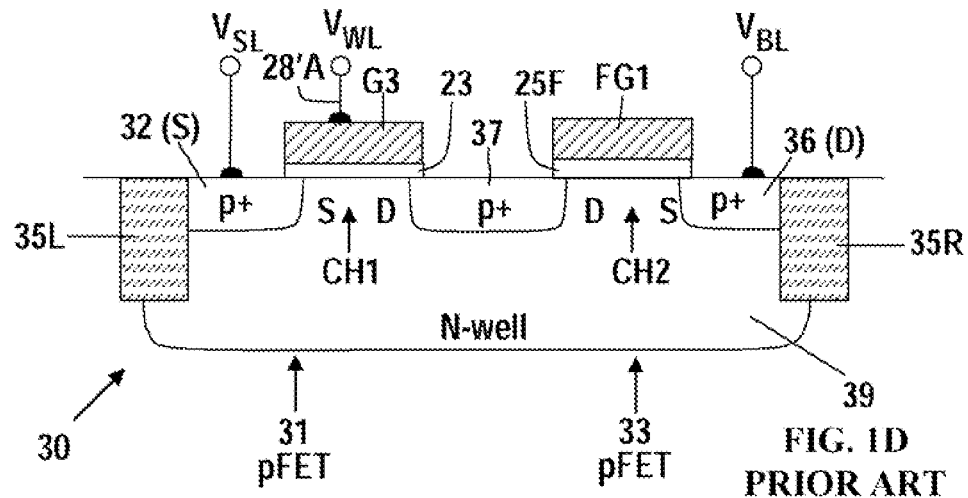
FIG. 1D shows a schematic diagram of a cross section of a prior art EPROM device comprising a pFET access device and a floating gate storage pFET device.

Tenth and Eleventh Embodiments: Programmable CMOS Floating Gate Inverter with Regular pFET in Parallel with Floating Gate pFET FIG. 11A shows the electrical schematic circuit diagram for a programmable CMOS inverter 1100. FIG. 1B is a voltage trace of the inverter 1100 of FIG. 11A in the "0" state. FIG. 11C is a voltage trace of the inverter 1100 of FIG. 11A in the "1" state. FIG. 11D is an electrical schematic diagram of a programmable inverter 1101 which is a modification of the inverter 1100 of FIG. 11A, which can be reprogrammed, as will be well understood by those skilled in the art in view of the above description of similar structures.

FIG. 12A shows the electrical schematic circuit diagram for a programmable CMOS inverter 1200. FIG. 12B is a voltage trace of the inverter 1200 of FIG. 12A in the "0" state. FIG. 12C is a voltage trace of the inverter 1200 of FIG. 12A in the "1" state. FIG. 112D is an electrical schematic diagram of a programmable inverter 1201 which is a modification of the inverter 1200 of FIG. 12A, which can be reprogrammed, as will be well understood by those skilled in the art in view of the above description of similar structures.

The noise margin of the programmable CMOS inverter of FIG. 7A can be enhanced by adding a pFET to the programmable CMOS inverter so that the regular pFET and the floating-gate pFET 13' are connected in parallel as shown in the electrical circuit schematic diagrams of FIGS. 11A and 12A. The design for the regular pFET 13R is the same as the pFET 13 of a regular CMOS inverter shown in FIG. 1A. Like elements of the diagrams in FIGS. 11A and 12A have identical functions to those shown in FIG. 7A.

The programmable inverters 700, 1100 and 1200 in FIGS. 7A, 11A and 12A have the same characteristics when the floating-gate pFET is programmed to be in the conducting state ("1" state). When the floating-gate pFET is in a nonconducting state ("0" state), the inverter 1100 in FIG. 11A and the inverter 1200 in FIG. 12A have less noise than the inverter 700 in FIG. 7A.

In FIG. 7A, if the floating-gate pFET 13' is not programmed, i.e. when the floating gate electrode FG7 is not storing electrons, the floating-gate memory element is in the '0' state and the floating-gate pFET 13' conducts weakly When the input is low, the output on line 24' is pulled high by the weakly conducting pFET 13'; but if the floating-gate pFET 13' does not conduct or conducts too weakly, it will not be able to pull the output all the way to Vdd. As a result, there can be high noise in the output signal $V_{OUT}$ on line 24'.

As shown in FIGS. 11A and 12A, the above-described output high noise problem can be avoided completely by adding a regular pFET 13R in parallel with the floating-gate pFET 13.' When the input is low, the added regular pFET is turned on by the input voltage and pulls the output to Vdd.

In FIG. 11A, the source of both the floating-gate pFET and the source of the added regular pFET are connected to the same voltage supply Vdd.

In FIG. 12A, the floating-gate pFET 13' and the added regular pFET 13R are connected to separate voltage supplies Vdd2 and Vdd1, respectively. This gives more flexibility in programming the floating-gate pFET 13'. For example, Vdd2 can be increased during programming to speed up the programming process. After programming is accomplished, Vdd2 can be returned to a lower value for normal circuit operation.

Figure 13A:
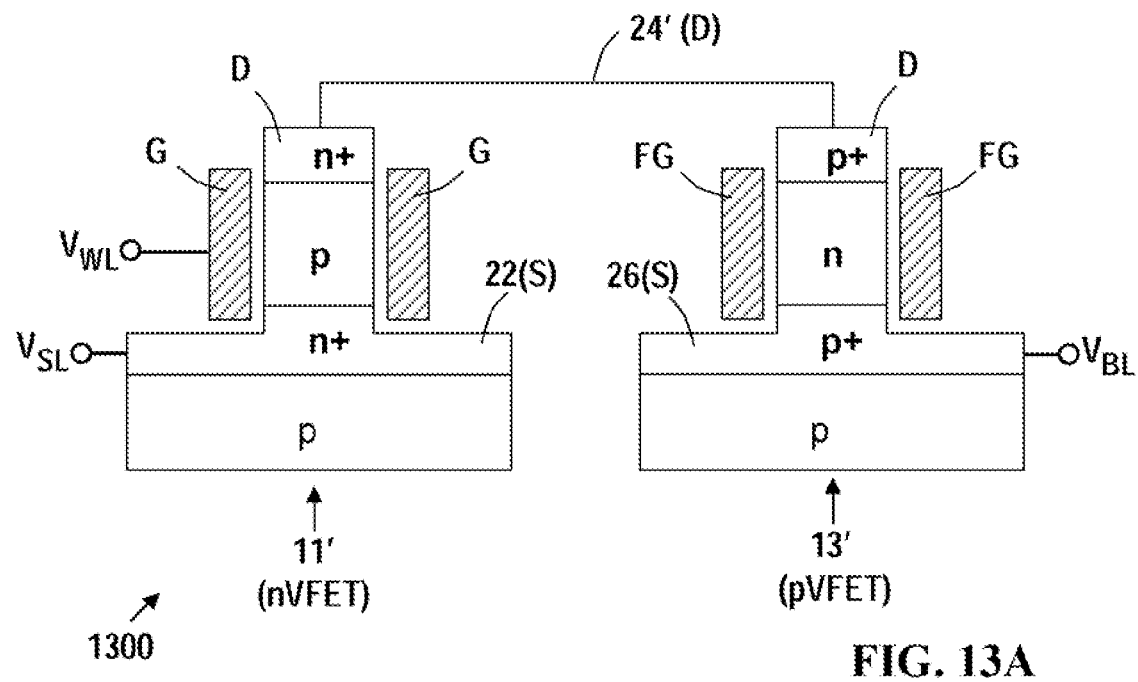
FIG. 13A shows a non-volatile, EPROM cell which includes a pair of vertical FET structures.
Figure 13B:
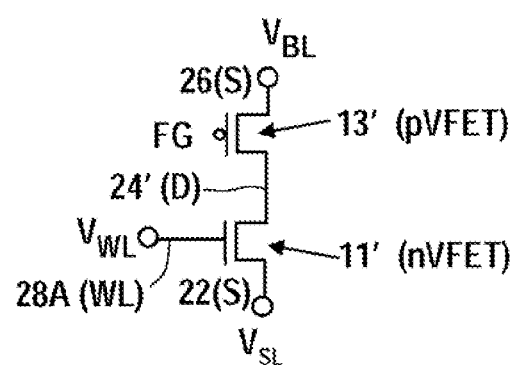
FIG. 13B is a circuit diagram of the access device and the floating-gate device which are both vertical FETs.

FIG. 13A shows a vertical FET embodiment of an EPROM cell 1300 and FIG. 13B shows the circuit diagram of the access device nFET 11' and the floating-gate pFET 13' thereof. Hereinabove, the present invention has been described with reference to FIGS. 2, 4, 5, 6, and 7 in terms of the most commonly used planar FET structures. There are other FET device structures in use. For example, as illustrated in FIG. 13A a non-volatile, EPROM cell 1300 includes a pair of vertical FET structures nVFET 11' and pVFET 13' are provided, where the device current flows vertically from sources 22(S) and 26(S) to the respective drains D which are interconnected by line 24' (D). It will be obvious to those with ordinary skill in the art that the present invention can be implemented with any FET device structure or any combinations of device structures.

Figure 14A:
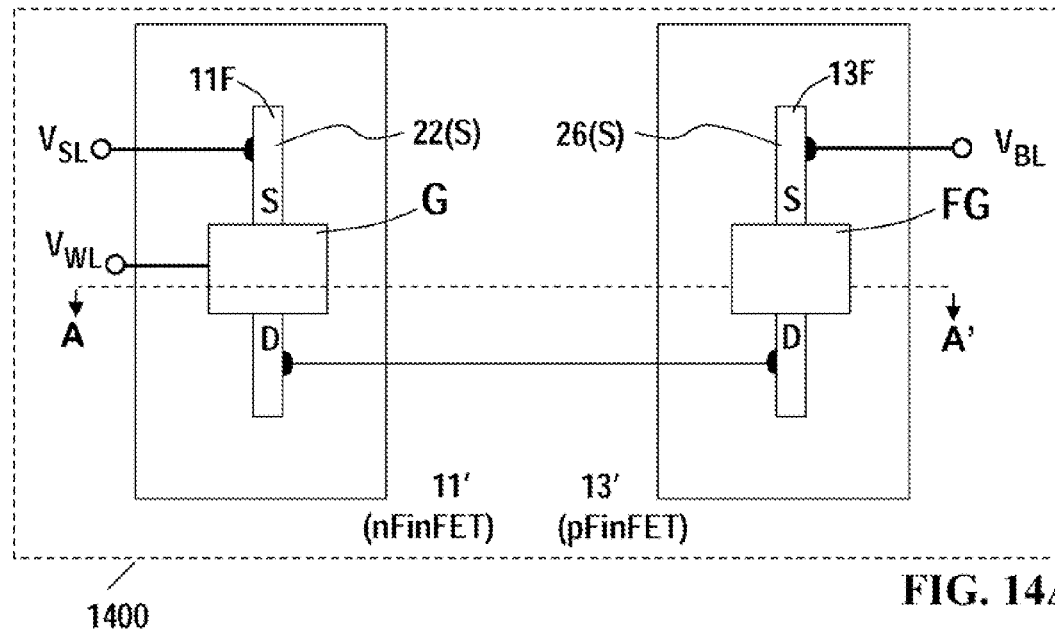
FIG. 14A is a plan view of a non-volatile, EPROM cell which includes a pair of FinFET devices.
Figure 14B:
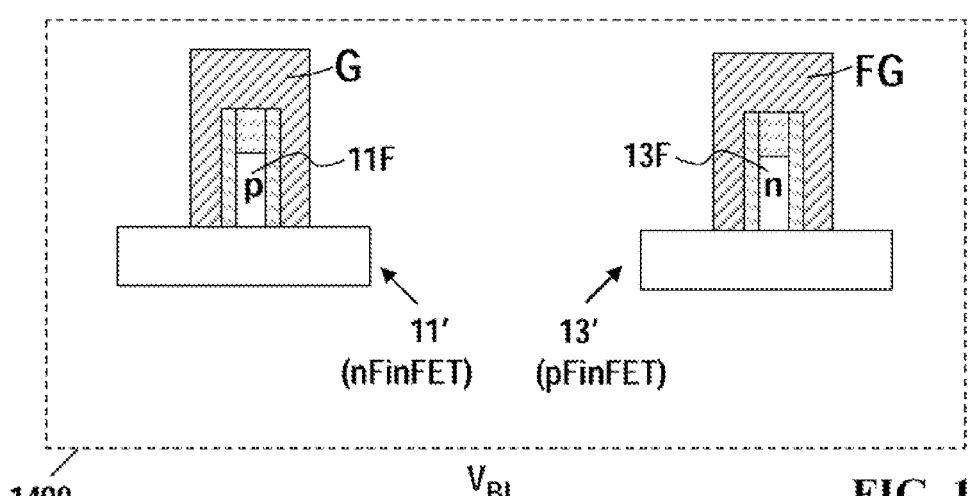
FIG. 14B shows a vertical section of the EPROM cell of FIG. 14A taken along line A-A' in FIG. 14A.
Figure 14C:
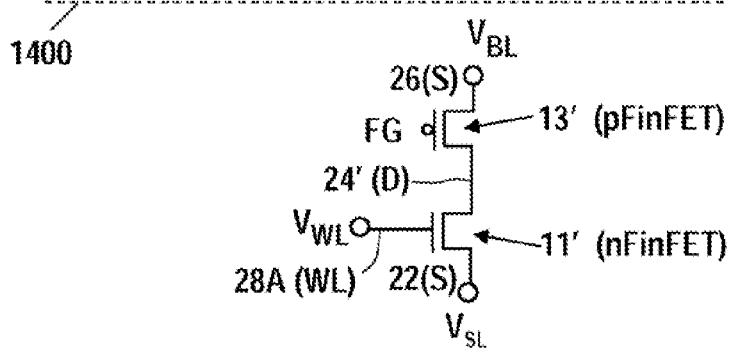
FIG. 14C is a circuit diagram of the EPROM cell of FIGS. 14A and 14B showing the access device nFET and the floating-gate pFET.

FIG. 14A is a plan view of a non-volatile, EPROM cell 1400 which includes a pair of FinFET structures nFinFET 11' and pFinFET 13'. The device bodies of FinFETs 11' and 13' comprise fins 11F and 13F respectively formed with very thin pieces of semiconductor like a fin, with two, i.e. dual, device conduction channels one on each of the vertical surfaces of the fins. FIG. 14B shows a vertical section of the EPROM cell 1400 taken along line A-A' in FIG. 14A. FIG. 14C is a circuit diagram of the EPROM cell 1400 shown in FIGS. 14A and 14B showing the access device nFET 11' and the floating-gate pFET 13' which are both FinFETs.

Figure 15:
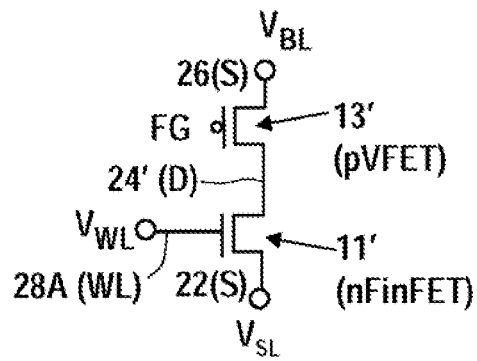
FIG. 15 shows an EPROM cell wherein the access FET is an nFinFET and the floating-gate pFET is a vertical pVFET.

FIG. 15 shows an EPROM cell wherein the access FET is an nFinFET and the floating-gate pFET is a vertical pVFET.

Figure 16:
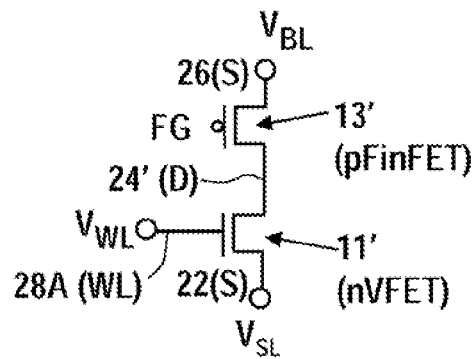
FIG. 16 shows an EPROM cell wherein, the access FET is a vertical nVFET and the floating-gate FET is a pFinFET.

FIG. 16 shows an EPROM cell wherein, the access FET is a vertical nVFET and the floating-gate pFET is a pFinFET.

Figure 17:
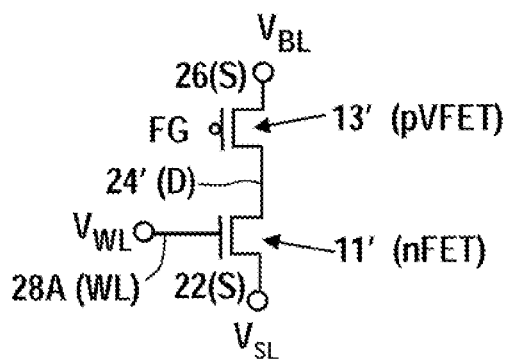
FIG. 17 shows an EPROM cell wherein the access FET is a planar nFET, such as one shown in FIGS. 2, 4, 5, 6, and 7, and the floating-gate FET is a vertical pVFET.

FIG. 17 shows an EPROM cell wherein the access FET is a planar nFET, such as one shown in FIGS. 2, 4, 5, 6, and 7, and the floating-gate pFET is a vertical pVFET.

Figure 18:
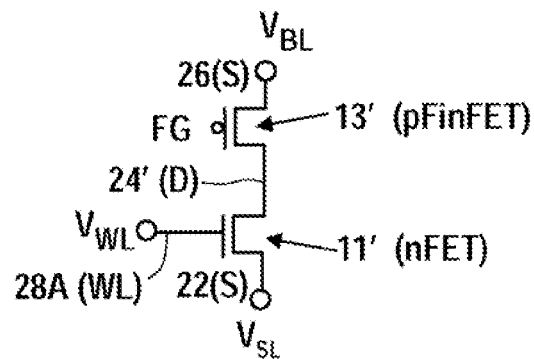
FIG. 18 shows an EPROM cell wherein the access FET is a planar nFET, such as one shown in FIGS. 2, 4, 5, 6, and 7, and the floating-gate FET is a pFinFET.

FIG. 18 shows an EPROM cell wherein the access FET is a planar nFET, such as one shown in FIGS. 2, 4, 5, 6, and 7, and the floating-gate pFET is a pFinFET.

Figure 19:
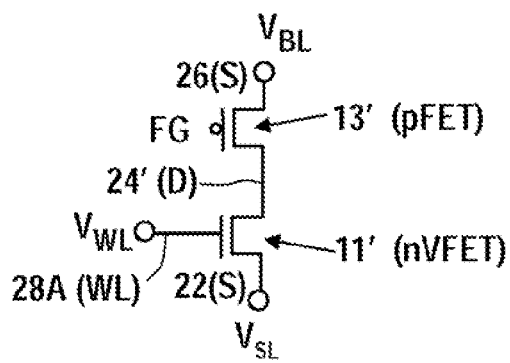
FIG. 19 shows an EPROM cell wherein the access FET is a vertical nVFET and the floating-gate FET is a planar pFET.

FIG. 19 shows an EPROM cell wherein the access FET is a vertical nVFET and the floating-gate pFET is a planar pFET.

Figure 20:
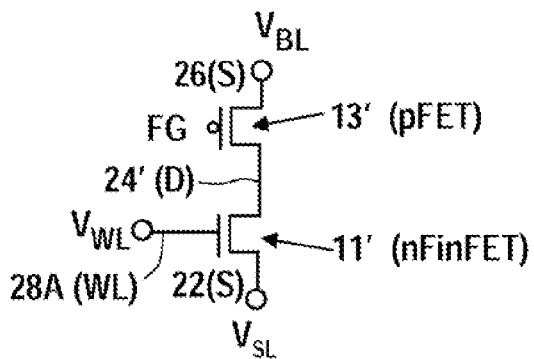
FIG. 20 shows an EPROM cell wherein the access FET is an nFinFET, and the floating-gate FET is a planar pFET.

FIG. 20 shows an EPROM cell wherein the access FET is an nFinFET, and the floating-gate pFET is a planar pFET.

Figure 21:
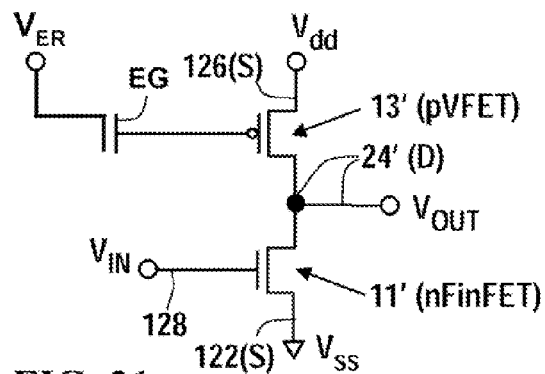
FIG. 21 shows a reprogrammable inverter where the nFET is an nFinFET and the floating-gate pFET is a vertical pVFET.

FIG. 21 shows a reprogrammable inverter wherein the nFET of the inverter is an nFinFET and the floating-gate pFET is a vertical pVFET.

Figure 22:
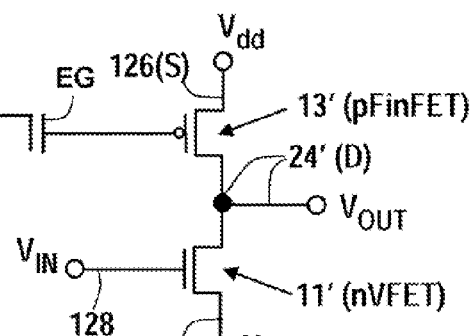
FIG. 22 shows a reprogrammable inverter wherein the nFET is a vertical nVFET and the floating-gate pFET is a pFinFET.

FIG. 22 shows a reprogrammable inverter wherein the nFET is a vertical nVFET and the floating-gate pFET is a pFinFET.

Figure 23:
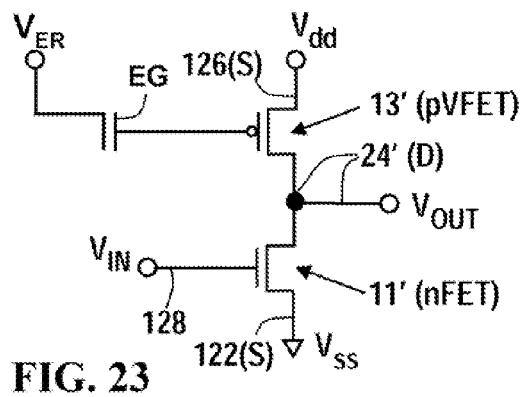
FIG. 23 shows a reprogrammable inverter wherein the nFET is a planar nFET and the floating-gate pFET is a vertical pVFET.

FIG. 23 shows a reprogrammable inverter wherein the nFET is a planar nFET and the floating-gate pFET is a vertical pVFET.

Figure 24:
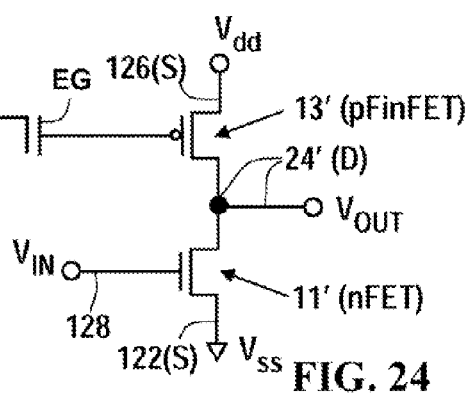
FIG. 24 shows a reprogrammable inverter wherein the nFET is a planar nFET and the floating-gate pFET is a pFinFET.

FIG. 24 shows a reprogrammable inverter wherein the nFET is a planar nFET and the floating-gate pFET is a pFinFET.

Figure 25:
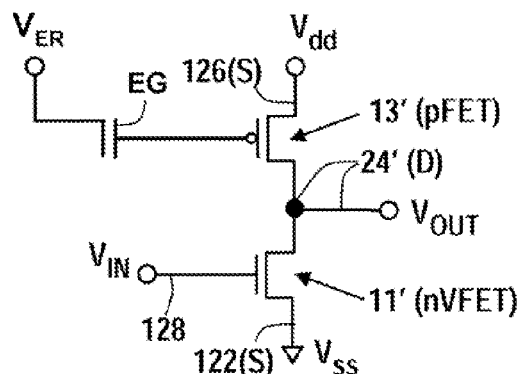
FIG. 25 shows a reprogrammable inverter wherein the nFET is a vertical nVFET and the floating-gate pFET is a planar pFET.

FIG. 25 shows a reprogrammable inverter wherein the nFET is a vertical nVFET and the floating-gate pFET is a planar pFET.

Figure 26:
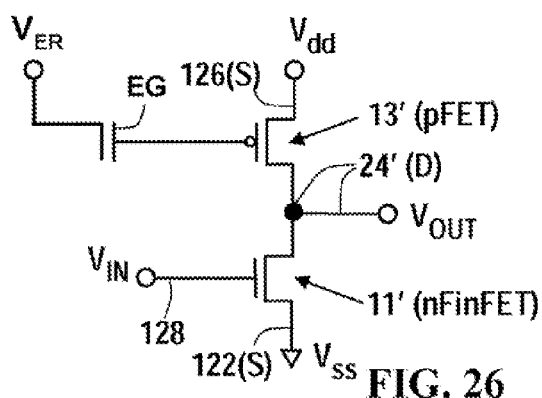
FIG. 26 shows a reprogrammable inverter wherein the nFET is an nFinFET, and the floating-gate pFET is a planar pFET.

FIG. 26 shows a reprogrammable inverter wherein the nFET is an nFinFET, and the floating-gate pFET is a planar pFET.

The same kinds of combinations can be provided for all of the other embodiments of this invention, which will be well understood by those skilled in the art.

The foregoing description discloses only exemplary embodiments of the invention. Modifications of the above disclosed apparatus and methods which fall within the scope of the invention will be readily apparent to those of ordinary skill in the art. While this invention is described in terms of the above specific exemplary embodiment(s), those skilled in the art will recognize that the invention can be practiced with modifications within the spirit and scope of the appended claims, i.e. changes can be made in form and detail, without departing from the spirit and scope of the invention. Accordingly, while the present invention is disclosed in connection with exemplary embodiments thereof, it should be understood that changes can be made to provide other embodiments which may fall within the spirit and scope of the invention and all such changes come within the purview of the present invention and the invention encompasses the subject matter defined by the following claims.

What is claimed is:

1. A CMOS device comprising:
   a substrate;
   a semiconductor nFET formed in and/or upon said substrate including a first source region, a first channel region, and a first drain region;
   a thin gate dielectric layer formed above said first channel region and a first gate electrode formed above said thin gate dielectric layer;
   a semiconductor pFET device formed in and/or upon said substrate juxtaposed with said nFET device and including a second source region, a second channel region, and a second drain region;
   a thick gate dielectric layer formed above said second channel region and a floating gate electrode formed above said thick gate dielectric layer, with said thick gate dielectric layer being substantially thicker than said thin gate dielectric layer in order to be resistant to unwanted tunneling of charge therethrough;
   a common drain node connected both to said first drain region and to said second drain region with no external connection to said common drain node in the case of a memory device and with an external connection to said common drain node in the case of an inverter; and
   external circuit connections to said first source region and to said second source region and to said first gate electrode.

2. The CMOS device of claim 1 wherein said substrate includes a Silicon on Insulator (SOI) layer formed on bulk silicon.

3. The CMOS device of claim 1 wherein said substrate includes an N-well for said pFET and a P-well for said nFET.

4. The CMOS device of claim 1 wherein said device comprises an EPROM memory.

5. The CMOS device of claim 4 wherein said substrate includes a Silicon on Insulator (SOI) layer formed on bulk silicon.

6. The CMOS device of claim 4 wherein said substrate includes an N-well for said pFET and a P-well for said nFET.

7. The CMOS device of claim 1 wherein said device comprises an EEPROM memory.

8. The CMOS device of claim 7 wherein said substrate includes an Silicon on Insulator (SOI) layer formed on bulk silicon.

9. The CMOS device of claim 7 wherein said substrate includes an N-well for said pFET and a P-well for said nFET.

10. The CMOS device of claim 1 wherein said device comprises a programmable inverter.

11. The CMOS device of claim 10 wherein said substrate includes an Silicon on Insulator (SOI) layer formed on bulk silicon.

12. The CMOS device of claim 10 wherein said substrate includes an N-well for said pFET and a P-well for said nFET.

13. The CMOS device of claim 10 including an additional pFET device with a thin gate dielectric layer formed in parallel with said semiconductor pFET.

14. A CMOS memory device comprising:
a substrate;
a semiconductor nFET device formed in and/or upon said substrate including a first source region, a first channel region, and a first drain region;
a thin gate dielectric layer formed above said first channel region and a first gate electrode formed above said thin gate dielectric layer;
a semiconductor pFET device formed in and/or upon said substrate juxtaposed with said nFET device and including a second source region, a second channel region, and a second drain region;
a thick gate dielectric layer formed above said second channel region and a floating gate electrode formed above said thick gate dielectric layer, with said thick gate dielectric layer being substantially thicker than said thin gate dielectric layer in order to be resistant to unwanted tunneling of charge therethrough;
a common drain node connected both to said first drain region and to said second drain region with no external connection to said common drain node; and
external circuit connections to said first source region and to said second source region and to said first gate electrode.

15. The CMOS memory device of claim 14 wherein said device comprises an EPROM memory.

16. The CMOS memory device of claim 14 wherein said device comprises an EEPROM memory.

17. A CMOS programmable inverter comprising:
a substrate;
a semiconductor nFET device formed in and/or upon said substrate including a first source region, a first channel region, and a first drain region;
a thin gate dielectric layer formed above said first channel region and a first gate electrode formed above said thin gate dielectric layer;
a semiconductor pFET device formed in and/or upon said substrate juxtaposed with said nFET device and including a second source region, a second channel region, and a second drain region;
a thick gate dielectric layer formed above said second channel region and a floating gate electrode formed above said thick gate dielectric layer, with said thick gate dielectric layer being substantially thicker than said thin gate dielectric layer in order to be resistant to unwanted tunneling of charge therethrough;
a common drain node connected both to said first drain region and to said second drain region; and
external circuit connections to said first source region and to said second source region and to said first gate electrode and to said common drain node with said common drain node comprising an output of said inverter.

18. The CMOS programmable inverter of claim 17 wherein said substrate is selected from the group consisting of an Silicon-On-Insulator (SOI) and an N-well for said pFET and a P-well for said nFET.

19. The CMOS device of programmable inverter of claim 17 including an additional pFET device with a thin gate dielectric layer formed in parallel with said semiconductor pFET.

20. The CMOS device of programmable inverter of claim 18 including an additional pFET device with a thin gate dielectric layer formed in parallel with said semiconductor pFET.

21. The CMOS device of claim 1 wherein at least one of said semiconductor pFET device and said semiconductor nFET device comprises a vertical FET.

22. The CMOS device of claim 1 wherein at least one of said semiconductor pFET device and said semiconductor nFET device comprises a FinFET.

23. The CMOS memory device of claim 14 wherein at least one of said semiconductor pFET device and said semiconductor nFET device comprises a vertical FET.

24. The CMOS memory device of claim 14 wherein at least one of said semiconductor pFET device and said semiconductor nFET device comprises a FinFET.

25. The inverter of claim 17 wherein at least one of said semiconductor pFET device and said semiconductor nFET device comprises a vertical FET or a FinFET.

* * * * *